(12) United States Patent
Jang et al.

(10) Patent No.: US 12,363,999 B2
(45) Date of Patent: *Jul. 15, 2025

(54) FIN FIELD-EFFECT TRANSISTOR AND METHOD OF FORMING THE SAME

(71) Applicant: Taiwan Semiconductor Manufacturing Company Ltd., Hsinchu (TW)

(72) Inventors: Shu-Uei Jang, Hsinchu (TW); Shih-Yao Lin, New Taipei (TW); Chieh-Ning Feng, Taichung (TW); Shu-Yuan Ku, Zhubei (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/749,014

(22) Filed: Jun. 20, 2024

(65) Prior Publication Data

US 2024/0347534 A1 Oct. 17, 2024

Related U.S. Application Data

(62) Division of application No. 17/460,583, filed on Aug. 30, 2021, now Pat. No. 12,046,597.

(51) Int. Cl.
*H10D 84/83* (2025.01)
*H10D 30/01* (2025.01)
(Continued)

(52) U.S. Cl.
CPC ....... *H10D 84/834* (2025.01); *H10D 30/0243* (2025.01); *H10D 30/6211* (2025.01);
(Continued)

(58) Field of Classification Search
CPC ............. H10D 84/834; H10D 30/0243; H10D 30/6211; H10D 64/017; H10D 84/0158
See application file for complete search history.

(56) References Cited

U.S. PATENT DOCUMENTS

2021/0126109 A1* 4/2021 Lin ..................... H01L 27/0886
2021/0242093 A1* 8/2021 Lin ..................... H10D 84/0184
(Continued)

OTHER PUBLICATIONS

Final Office Action on U.S. Appl. No. 17/460,583 DTD Jan. 12, 2024.
(Continued)

*Primary Examiner* — Christine A Enad
(74) *Attorney, Agent, or Firm* — FOLEY & LARDNER LLP

(57) ABSTRACT

A method for making a semiconductor device includes: forming a first semiconductor fin structure and a second semiconductor fin structure over a substrate that both extend along a first lateral direction; forming a dummy gate structure that extends along a second lateral direction perpendicular to the first direction and straddles the first and second semiconductor fin structures; removing a portion of the dummy gate structure between the first and second semiconductor fin structures to form a trench, a width of the trench along the second direction decreasing with increasing depth toward the substrate; filling the trench with a dielectric material; and removing the second semiconductor fin structure and a portion of the dielectric material.

20 Claims, 18 Drawing Sheets

(51) Int. Cl.
  *H10D 30/62* (2025.01)
  *H10D 64/01* (2025.01)
  *H10D 84/01* (2025.01)
  *H10D 84/03* (2025.01)

(52) U.S. Cl.
  CPC ....... *H10D 64/017* (2025.01); *H10D 84/0158* (2025.01); *H10D 84/038* (2025.01)

(56) References Cited

U.S. PATENT DOCUMENTS

2022/0328357 A1* 10/2022 Lin ................. H01L 21/823814
2024/0021480 A1* 1/2024 Chiang ........... H01L 21/823431

OTHER PUBLICATIONS

Non-Final Office Action on U.S. Appl. No. 17/460,583 DTD Sep. 21, 2023.
Notice of Allowance on U.S. Appl. No. 17/460,583 DTD Apr. 26, 2024.

* cited by examiner

FIN FIELD-EFFECT TRANSISTOR AND METHOD OF FORMING THE SAME

CROSS-REFERENCE TO RELATED APPLICATIONS

This application is a divisional of U.S. Utility application Ser. No. 17/460,583, filed Aug. 30, 2021, the entire disclosure of which is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises one or more fins protruding from a substrate. A gate structure, configured to control the flow of charge carriers within a conductive channel of the FinFET device, wraps around the one or more fins. For example, in a tri-gate FinFET device, the gate structure wraps around three sides of each of the one or more fins, thereby forming conductive channels on three sides of each of the one or more fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
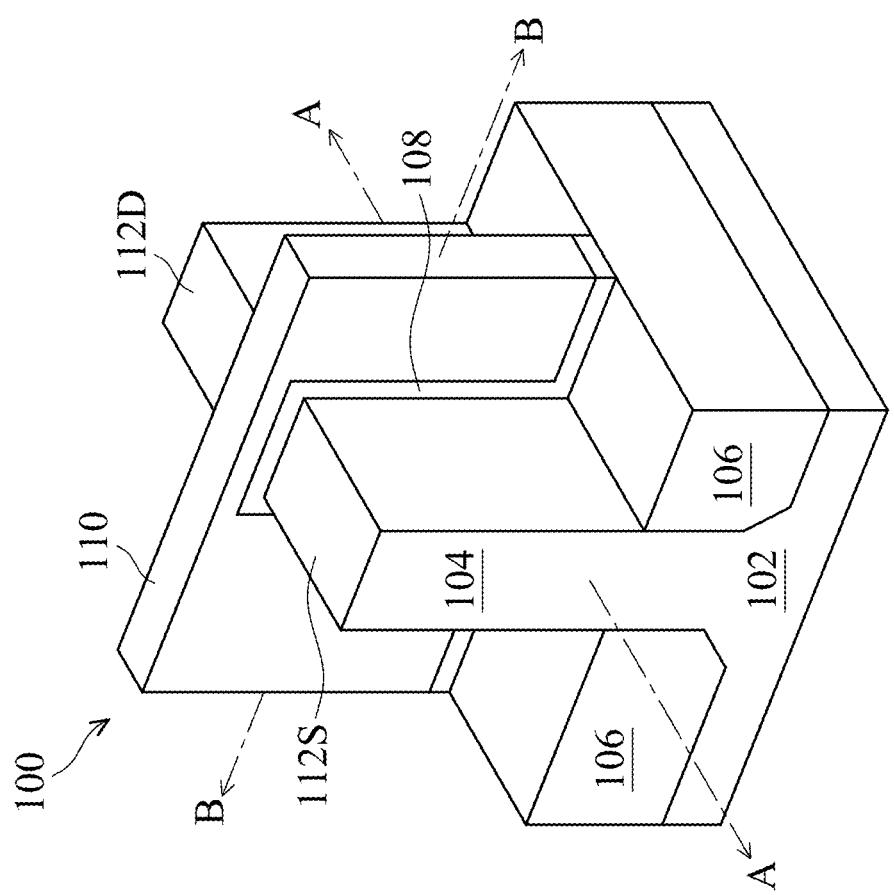
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit typically includes a large number of devices (e.g., transistors). To fabricate these devices, a number of (e.g., planar and/or non-planar) active regions and a number of gate structures that intersect the active regions can be formed on a substrate or wafer to define such devices. To further configure those transistors to operate as certain circuits, some of the transistors can be operatively connected to or disconnected from each other. In general, to disconnect transistors in a relatively dense area of the substrate, a dummy gate structure overlaying multiple fin structures can be cut into multiple portions that overlay the respective fin structures of those disconnected devices. Such cut portions can be electrically isolated by a gate isolation structure. On the other hand, to disconnect transistors in a relatively sparse area of the substrate, a dummy gate structure overlaying multiple fin structures can be patterned, thereby removing a portion of the dummy gate structure that overlays one or more of the fin structures not configured as active channels.

In the existing technologies, while removing a first portion of the dummy gate structure (and the underlying fin structure(s) not configured as active channels, i.e., inactive channel) in the relatively sparse area, a second portion of the dummy gate structure that overlays the fin structure(s) configured as active channels may be damaged, which adversely impacts the profile of an active gate structure that replaces the second portion of the dummy gate structure. For example, a certain portion of a gate isolation structure located between the first and second portions may also be removed, during the removal process of the first portion. Since the gate isolation structure typically follows profiles and dimensions of a dummy fin structure disposed between the active and inactive channels (e.g., having nearly vertical sidewalls), etchants used in the removal process can easily penetrate through the gate isolation structure (e.g., an upper portion) and damage the second portion.

The present disclosure provides various embodiments of a semiconductor device that includes a number of transistors (e.g., FinFETs), and a method for forming the same. In some embodiments, in a relatively sparse area of a substrate, a gate isolation structure with a reverse-trapezoid profile (e.g., a wider upper portion and narrower lower portion) can be formed between two portions of a dummy gate structure. In this way, while removing a first portion of the dummy gate structure (that overlays an inactive channel), the wider upper portion of the gate isolation structure can provide further buffer, thereby preventing etchants from penetrating to a second portion of the dummy gate structure (that overlays an active channel). As such, the profiles and dimensions of an active gate structure, which replaces the second portion of the dummy gate structure, can be accurately defined and reserved.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
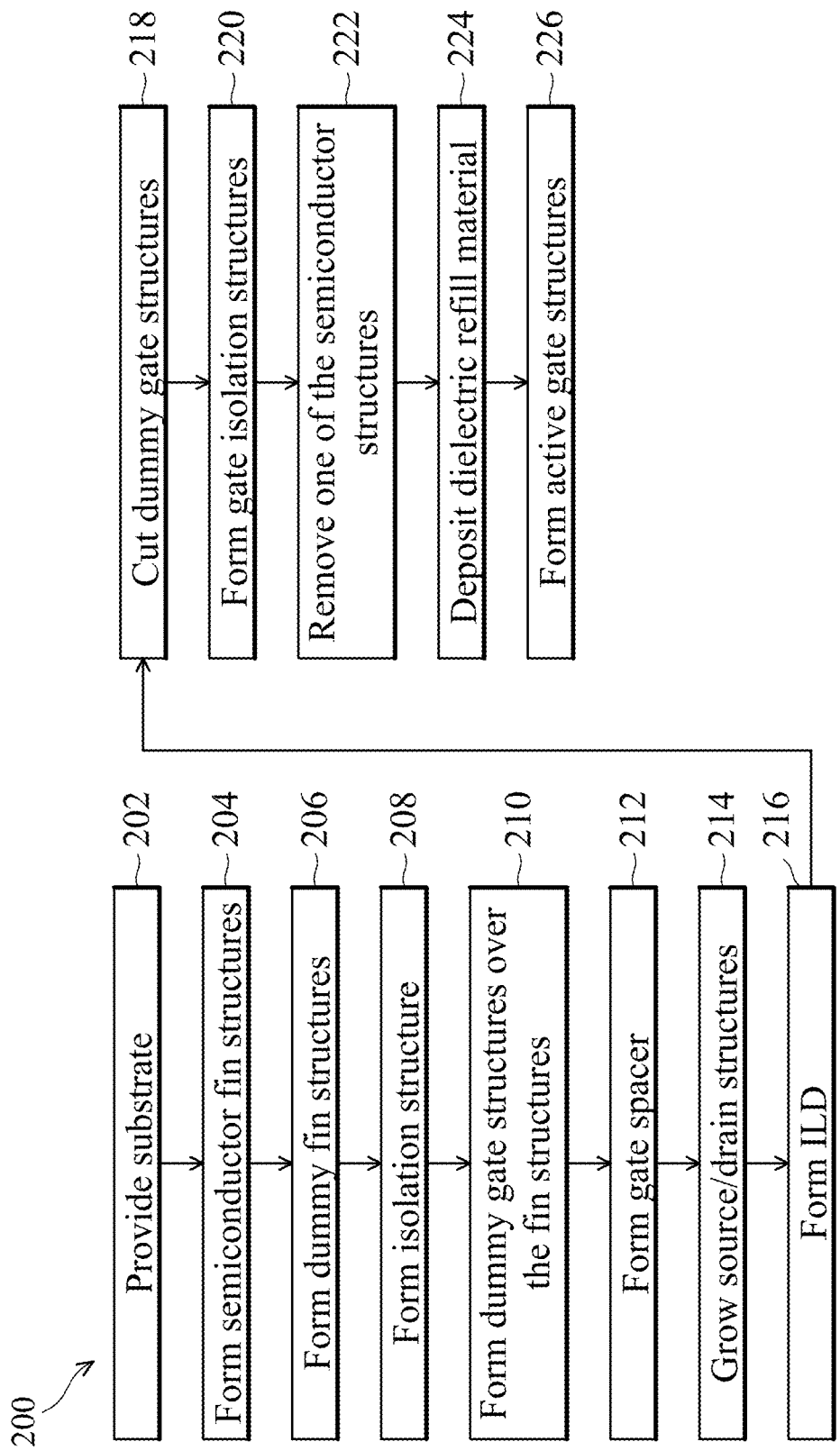
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanostructure transistor, like nanosheet transistor device, a nanowire transistor device, gate-all-around transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15, 16, 17, and 18, respectively, which will be discussed in further detail below.

In brief overview, the method 200 starts with operation 202 of providing a substrate. The method 200 continues to operation 204 of forming a number of semiconductor fin structures. The method 200 continues to operation 206 of forming a number of dummy fin structures. The method 200 continues to operation 208 of forming an isolation structure. The method 200 continues to operation 210 of forming dummy gate structures over the fin structures. The method 200 continues to operation 212 of forming a gate spacer. The method 200 continues to operation 214 of growing source/drain structures. The method 200 continues to operation 216 of forming an interlayer dielectric (ILD). The method 200 continues to operation 218 of cutting the dummy gate structures. The method 200 proceeds to operation 220 of forming gate isolation structures. The method 200 proceeds to operation 222 of removing one of the semiconductor fin structures in a dense area of the substrate. The method 200 continues to operation 224 of depositing a dielectric refill material. The method 200 continues to operation 226 of forming active gate structures.

As mentioned above, FIGS. 3-18 each illustrate, in a cross-sectional view, a portion of a FinFET device 300 at various fabrication stages of the method 200 of FIG. 2. The FinFET device 300 is similar to the FinFET device 100 shown in FIG. 1, but with multiple gate structures and multiple fins. Although FIGS. 3-18 illustrate the FinFET device 300, it is understood the FinFET device 300 may include a number of other devices such as inductors, fuses, capacitors, coils, etc., which are not shown in FIGS. 3-18, for purposes of clarity of illustration.

Figure 3:
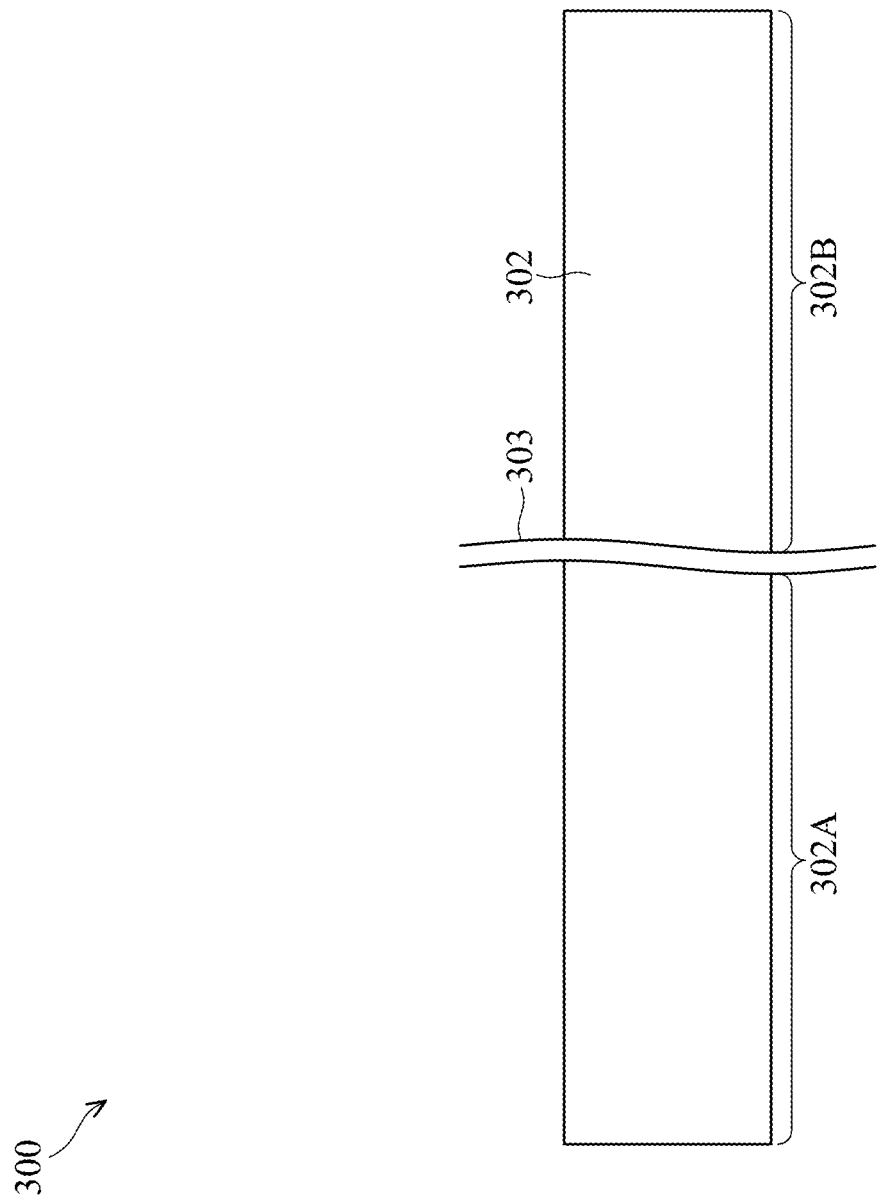
FIGS. 3, 4, 5, 6, 7, 8, 9, 10, 11, 12, 13, 14, 15, 16, 17, and 18 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication, in some embodiments. The cross-sectional view of the FinFET device 300 in FIG. 3 is cut along the lengthwise direction of a gate structure, e.g., cross-section B-B (as indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the FinFET device 300 can include areas 302A and 302B. The area 302A can be configured to form a number of input/output (I/O) transistors (hereinafter "I/O area 302A"); and the area 302B can be configured to form a number of core transistors (hereinafter "core area 302B"). The terms "I/O transistor" and "core transistor," as used herein, may be generally referred to a transistor configured to operate under a relatively higher voltage (e.g., higher $V_{gs}$) and a transistor configured to operate under a relatively lower voltage (e.g., lower $V_{gs}$), respectively. Thus, it should be understood that the I/O transistor can include any of various other transistors operating under a relatively higher voltage and the core transistor can include any of various other transistors operating under a relatively lower voltage, while remaining within the scope of the present disclosure. The I/O transistor, when appropriately configured, may have a relatively thicker gate dielectric; and the core transistor, when appropriately configured, has a relatively thinner gate dielectric. Further, the I/O transistors may be formed in a first area of the substrate (e.g., I/O area 302A) with a relatively lower density of transistors; and the core transistors may be formed in a second area of the substrate (e.g., core area 302B) with a relatively higher density of transistors. As such, features (e.g., fins) in the I/O area 302A may be more sparsely formed, when compared to the features (e.g., fins) formed in the core area 302B.

As shown in FIG. 3 (and the following figures), the I/O area 302A and core area 302B are separated from each other by a symbolic divider 303, which can include additional features/components/devices that are omitted for simplicity. It should be appreciated that some of the operations of the method 200 may be concurrently performed in the I/O area 302A and core area 302B. For purposes of illustration, some of the feature(s) formed in the I/O area 302A and the core area 302B are hereinafter shown in the same figure that corresponds to one of the operations of the method 200.

Figure 4:
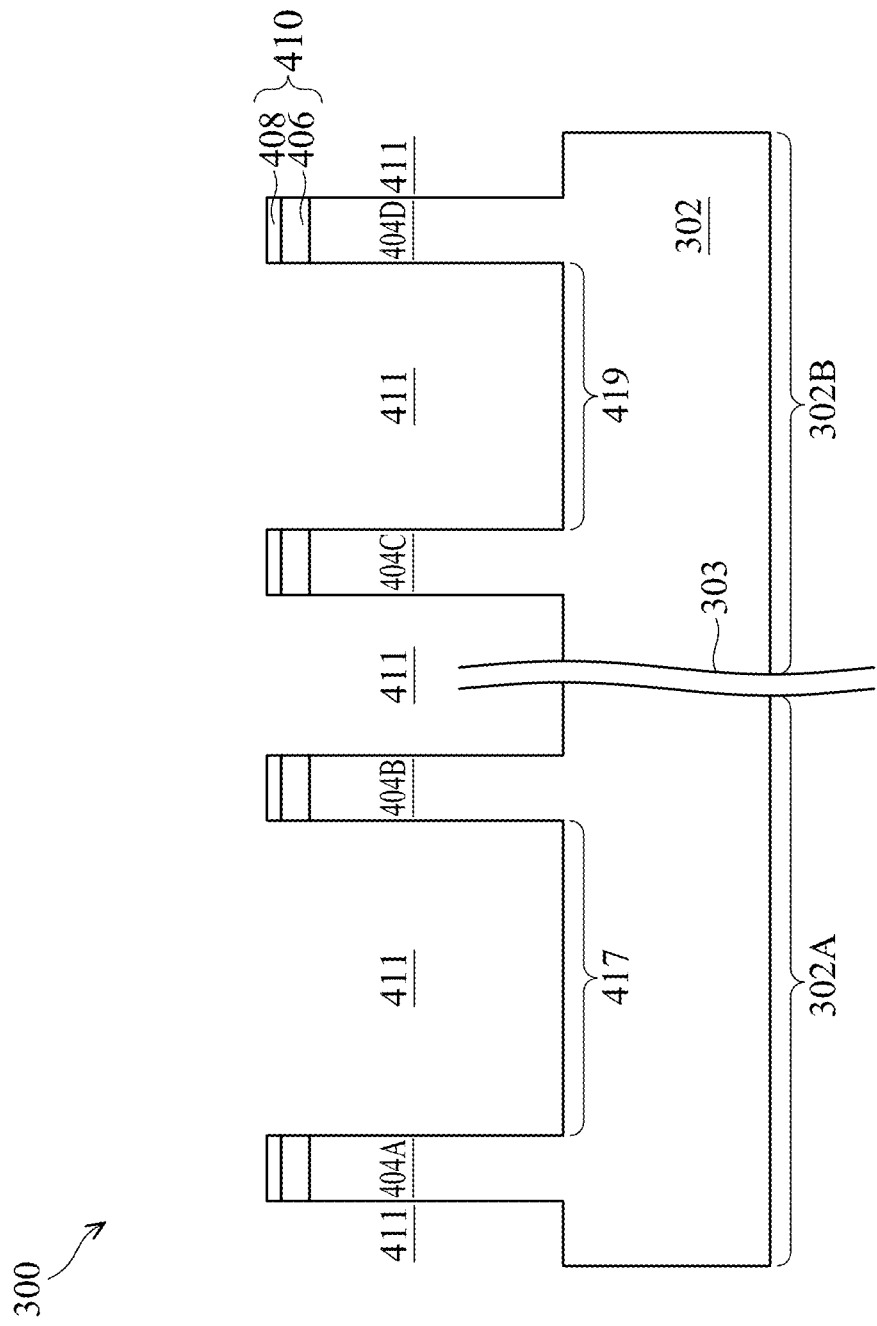

Corresponding to operation 204 of FIG. 2, FIG. 4 is a cross-sectional view of the FinFET device 300 including semiconductor fin structures 404A, 404B, 404C, and 404D at one of the various stages of fabrication. The cross-sectional view of FIG. 4 is cut along the lengthwise direction of an active/dummy gate structure of the FinFET device 300 (e.g., cross-section B-B indicated in FIG. 1).

The semiconductor fin structures 404A-B are formed in the I/O area 302A, and the semiconductor fin structures 404C-D are formed in the core area 302B. Although two semiconductor fin structures are shown in each of the I/O area 302A and core area 302B, it should be appreciated that the FinFET device 300 can include any number of semiconductor fin structures in each of the areas 302A and 302B while remaining within the scope of the present disclosure.

Some of the semiconductor fin structures 404A-D, if still remains, may be each configured as an active fin, which will be adopted as an active (e.g., electrically functional) fin or channel in a completed FinFET. In the illustrated examples, the semiconductor fin structure 404A may be configured as the active channel of a first input/output (I/O) transistor of the FinFET device 300 (sometimes referred to as "active I/O channel 404A"); the semiconductor fin structure 404B may be later removed from the FinFET device 300 (sometimes referred to as "inactive I/O channel 404B"); the semiconductor fin structure 404C may be configured as the active channel of a first core transistor of the FinFET device 300 (sometimes referred to as "active core channel 404C"); and the semiconductor fin structure 404D may be configured as the active channel of a second core transistor of the FinFET device 300 (sometimes referred to as "active core channel 404D").

The semiconductor fin structures 404A-D are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the semiconductor fin structures 404A-D between adjacent trenches 411 as illustrated in FIG. 4. When multiple fin structures are formed, such a trench may be disposed between any adjacent ones of the fin structures. In some embodiments, the semiconductor fin structures 404A-D are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the semiconductor fin structures 404A-D.

The semiconductor fin structures 404A-D may be patterned by any suitable method. For example, the semiconductor fin structures 404A-D may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

As shown in FIG. 4, the semiconductor fin structures 404A-B in the I/O area 302A are formed to be separated from each other with a first spacing 417, and the semiconductor fin structures 404C-D in the core area 302B are formed to be separated from each other with a second spacing 419. In various embodiments, the first spacing 417 can be substantially greater than the second spacing 419. For example with a certain process node, the first spacing 417 can range from about 5 nanometers (nm) to about 500 nm, and the second spacing 419 can range from about 5 nm to about 500 nm.

FIGS. 3 and 4 illustrate an embodiment of forming the semiconductor fin structures 404A-D, but a fin structure may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fin structures 404A-D that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fin structures.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fin structures.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fin structures 404A-D may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
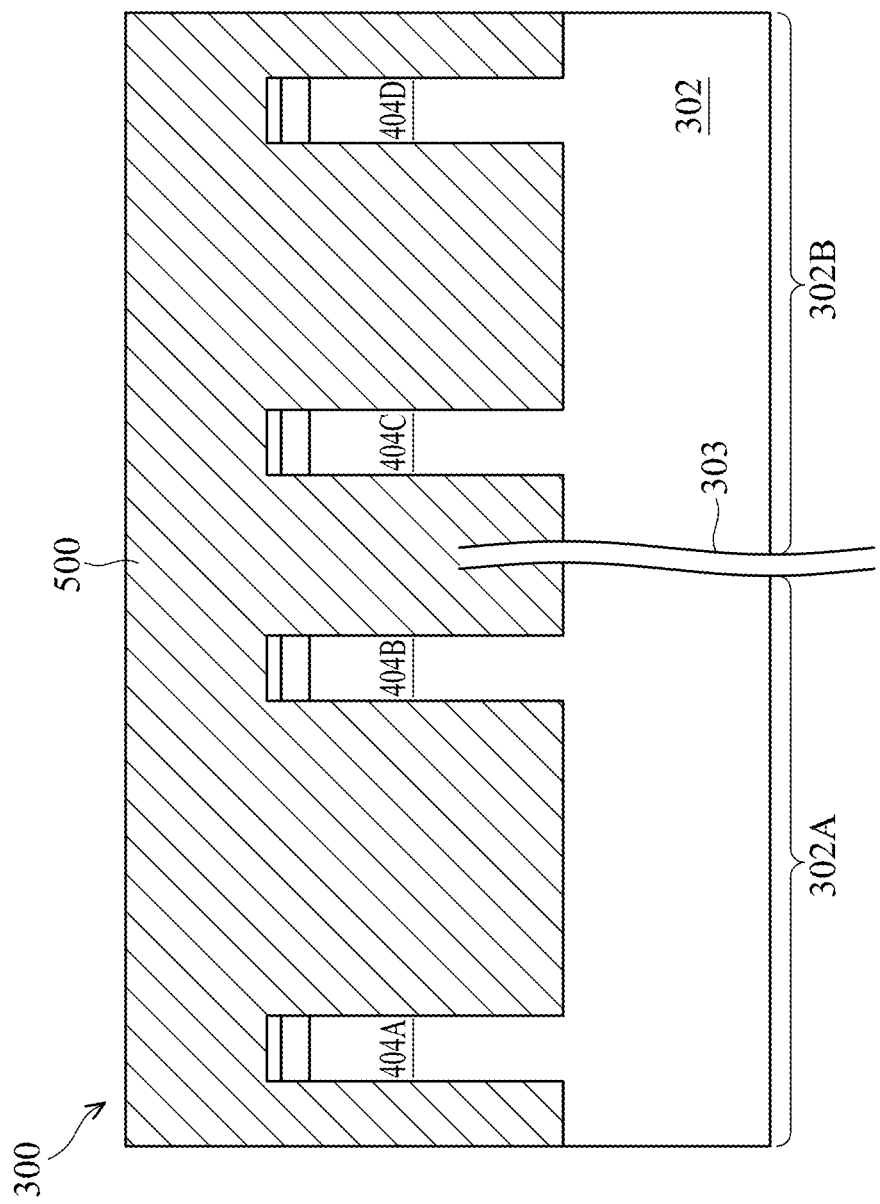
Figure 6:
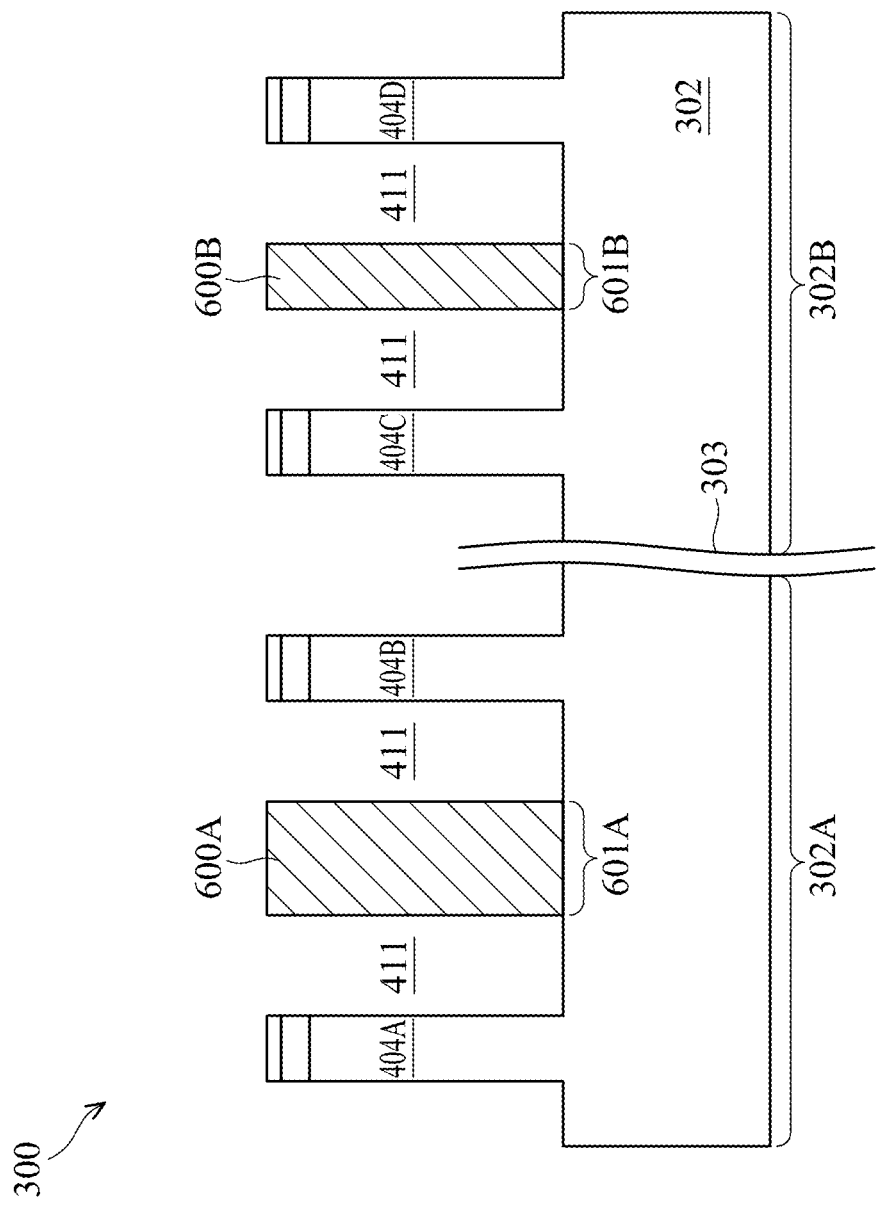

Corresponding to operation 206 of FIG. 2, FIG. 5 is a cross-sectional view of the FinFET device 300 including a dummy channel layer 500 at one of the various stages of fabrication at one of the various stages of fabrication, and FIG. 6 is a cross-sectional views of the FinFET device 300 including dummy fin structures 600A and 600B at one of the various stages of fabrication. The cross-sectional views of FIGS. 5 and 6 are each cut along the lengthwise direction of an active/dummy gate structure of the FinFET device 300 (e.g., cross-section B-B indicated in FIG. 1).

Although the dummy channel layer 500 is shown as being universally deposited over both of the areas 302A and 302B, it should be understood that similar dummy channel layers may be deposited over the I/O area 302A and the core area 302B, respectively.

In some embodiments, the dummy channel layer 500 can include a dielectric material used to form the dummy fin structures 600A-B. Accordingly, the dummy fin structures 600A-B are sometimes referred to as dielectric fin structures 600A-B. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer 500 may be formed using low-pressure chemical vapor deposition (LPCVD) or plasma enhanced chemical vapor deposition (PECVD), for example.

Upon depositing the dummy channel layer 500 overlaying the semiconductor fin structures 404A-D, one or more dummy fin structures, e.g., 600A and 600B, may be formed between the semiconductor fin structures 404A-D. For example, the dummy fin structure 600A may be formed between the fin structures 404A-B; and the dummy fin structure 600B may be formed between the fin structures 404C-D. The dummy fin structure 600A-B are formed by patterning the dummy channel layer 500 using, for example, photolithography and etching techniques. For example, a patterned mask (not shown) may be formed over the dummy channel layer 500 to mask portions of the dummy channel layer 500 to form the dummy fin structures 600A-B. Subsequently, unmasked portions of the dummy channel layer 500 may be etched using, for example, reactive ion etch (RIE), neutral beam etch (NBE), the like, or combinations thereof, thereby defining the dummy fin structures 600A-B between adjacent fin structures 404A-D (or in the trenches 411) as illustrated in FIG. 6. The etch may be anisotropic, in some embodiments. In some other embodiments, the dummy fin structures 600A-B may be formed concurrently with or subsequently to forming isolation regions (e.g., 700 of FIG. 7) between adjacent semiconductor fin structures, which will be discussed below.

As illustrated in FIG. 6, the dummy fin structure 600A formed in the I/O area 302A has a width (along a direction perpendicular to a lengthwise direction of the fin structures) 601A, and the dummy fin structure 600B formed in the core area 302B has a width (along the same direction) 601B. In various embodiments, the width 601A is substantially greater than the width 601B. For example with a certain process node, the width 601A can range from about 2 nanometers (nm) to about 200 nm, and the width 601B can range from about 2 nm to about 50 nm. In a non-limiting example, the width 601A is between about 15 nm and about 30 nm, and the width 601B is between about 11 nm and about 17 nm.

Figure 7:
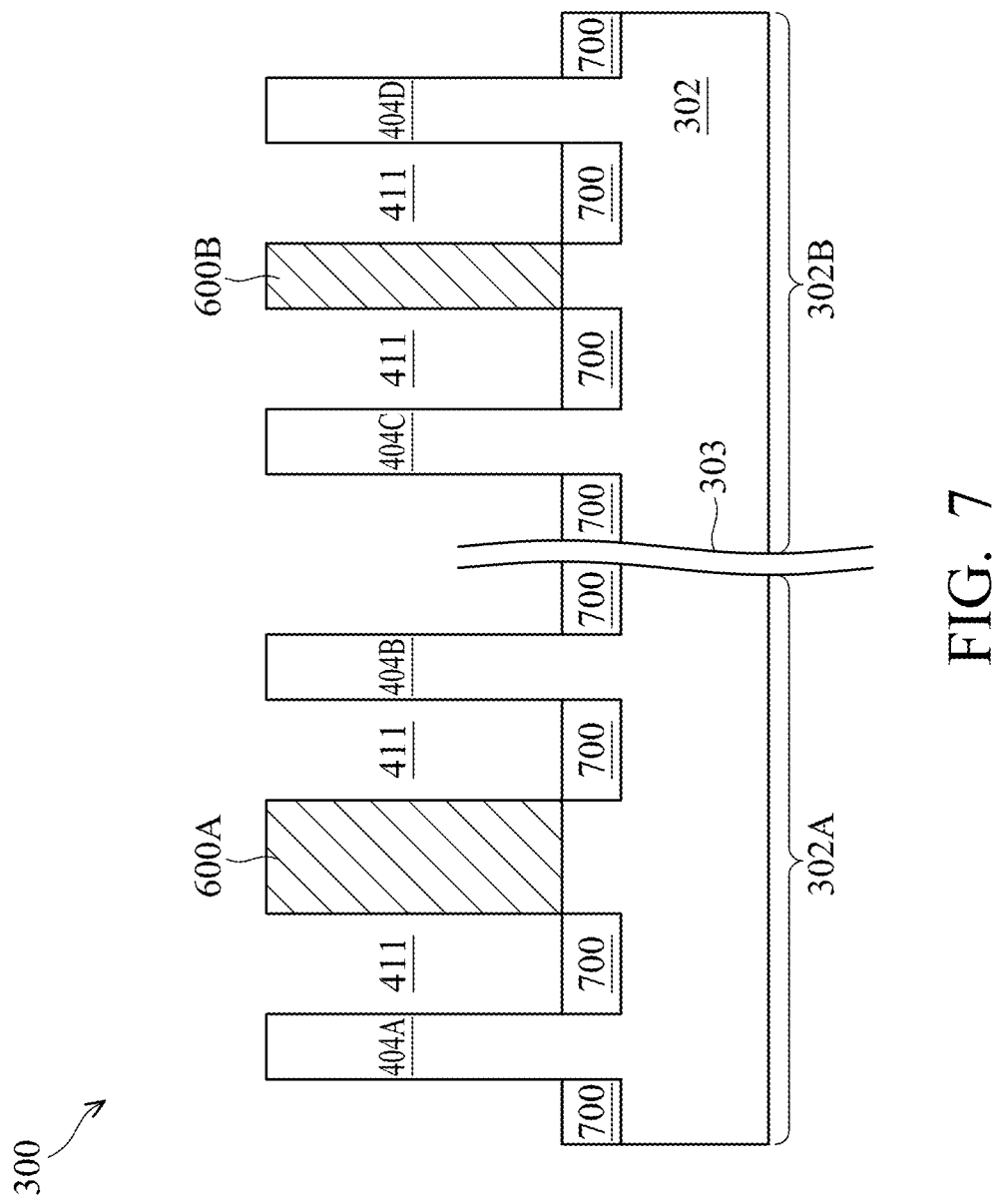

Corresponding to operation 208 of FIG. 2, FIG. 7 is a cross-sectional view of the FinFET device 300 including isolation regions 700 at one of the various stages of fabrication. The cross-sectional view of FIG. 7 is cut along the lengthwise direction of an active/dummy gate structure of the FinFET device 300 (e.g., cross-section B-B indicated in FIG. 1).

The isolation regions 700, which are formed of an insulation material, can electrically isolate neighboring fin structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 700 and a top surface of the fin structures 404A-D and 600A-B that are coplanar (not shown). The patterned mask 410 (FIG. 4) may also be removed by the planarization process.

In some embodiments, the isolation regions 700 include a liner, e.g., a liner oxide (not shown), at the interface between each of the isolation regions 700 and the substrate 302 (semiconductor fin structures 404A-D). In some embodiments, the liner oxide is formed to reduce crystalline defects at the interface between the substrate 302 and the isolation region 700. Similarly, the liner oxide may also be used to reduce crystalline defects at the interface between the fin structures 404A-D and the isolation region 700. The liner oxide (e.g., silicon oxide) may be a thermal oxide formed through a thermal oxidation of a surface layer of the substrate 302, although other suitable method may also be used to form the liner oxide.

Next, the isolation regions 700 are recessed to form shallow trench isolation (STI) regions 700, as shown in FIG. 7. The isolation regions 700 are recessed such that the upper portions of the fin structures 404A-D and 600A-B protrude from between neighboring STI regions 700. Respective top surfaces of the STI regions 700 may have a flat surface (as illustrated), a convex surface, a concave surface (such as dishing), or combinations thereof. The top surfaces of the STI regions 700 may be formed flat, convex, and/or concave by an appropriate etch. The isolation regions 700 may be recessed using an acceptable etching process, such as one that is selective to the material of the isolation regions 700. For example, a dry etch or a wet etch using dilute hydrofluoric (DHF) acid may be performed to recess the isolation regions 700.

Figure 8:
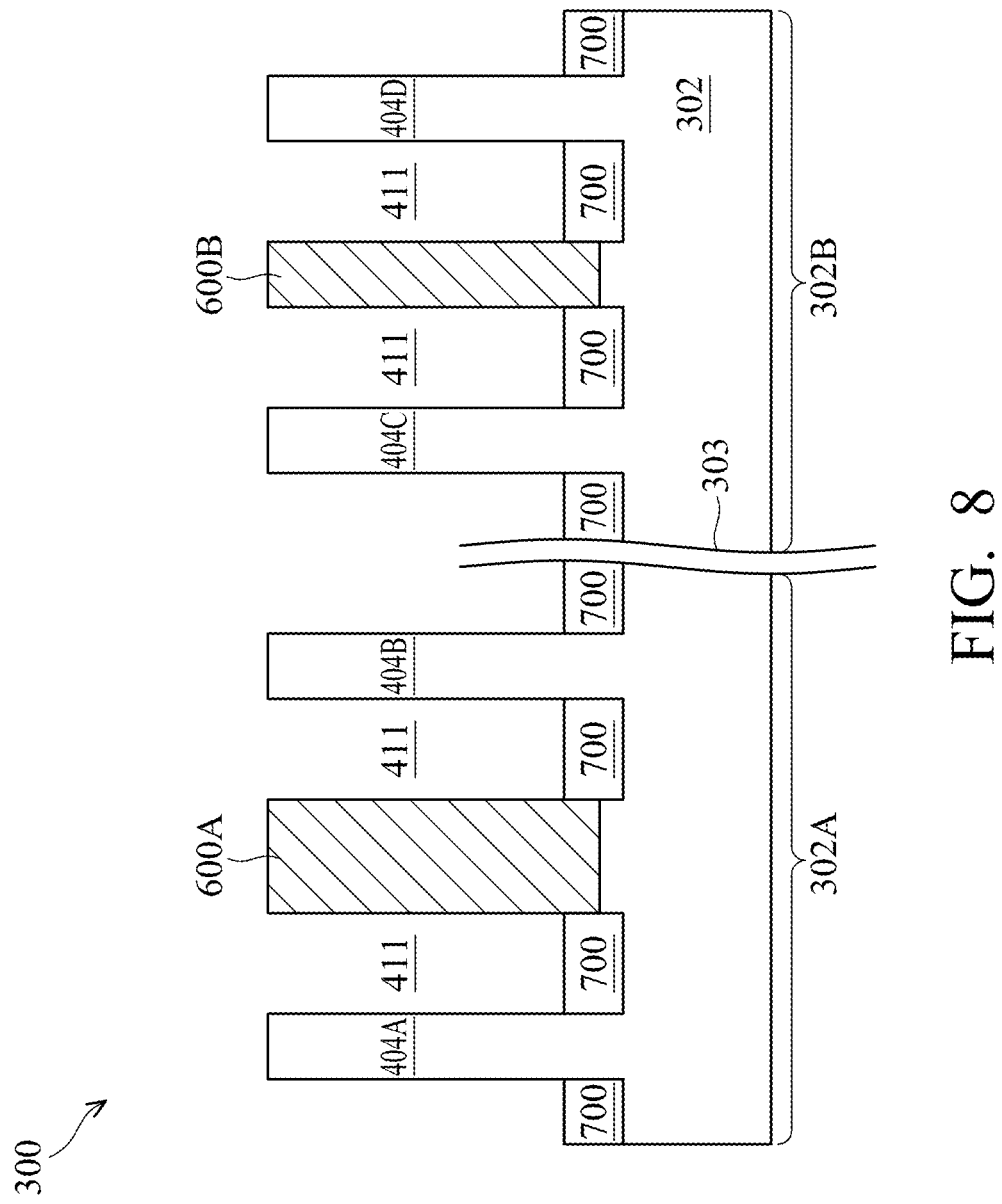

As mentioned above, the dummy fin structures 600A-B may be formed concurrently with or subsequently to the formation of the isolation regions 700. As an example, when forming the fin structures 404A-D (FIG. 4), one or more other semiconductor fin structures may also be formed in the trenches 411. The insulation material of the isolation regions 700 may be deposited over the active fins, followed by a CMP process to planarize the top surfaces of the isolation regions 700 and the active fins, which include the semiconductor fin structures 404A-D and the semiconductor fin structure(s) formed in the trenches 411. Subsequently, an upper portion of each of the semiconductor fin structure(s)

formed in the trenches 411 may be partially removed to form cavity. The cavity is then filled with the dielectric material of the dummy channel layer 500, followed by another CMP process to form the dummy fin structures 600A-B. The isolation regions 700 are recessed to form the shallow trench isolation (STI) regions 700, as shown in FIG. 8. Using such a method to form the dummy fin structures 600A-B, the dummy fin structures 600A-B are formed on the substrate 302 and a bottom surface of the dummy fin structures 600A-B is below the top surface of the isolation regions 700, as shown in FIG. 8. Depending on how much of the isolation regions 700 is recessed, the bottom surface of the dummy fin structures 600A-B may be above the top surface of the isolation regions 700, while remaining within the scope of the present disclosure.

Figure 9:
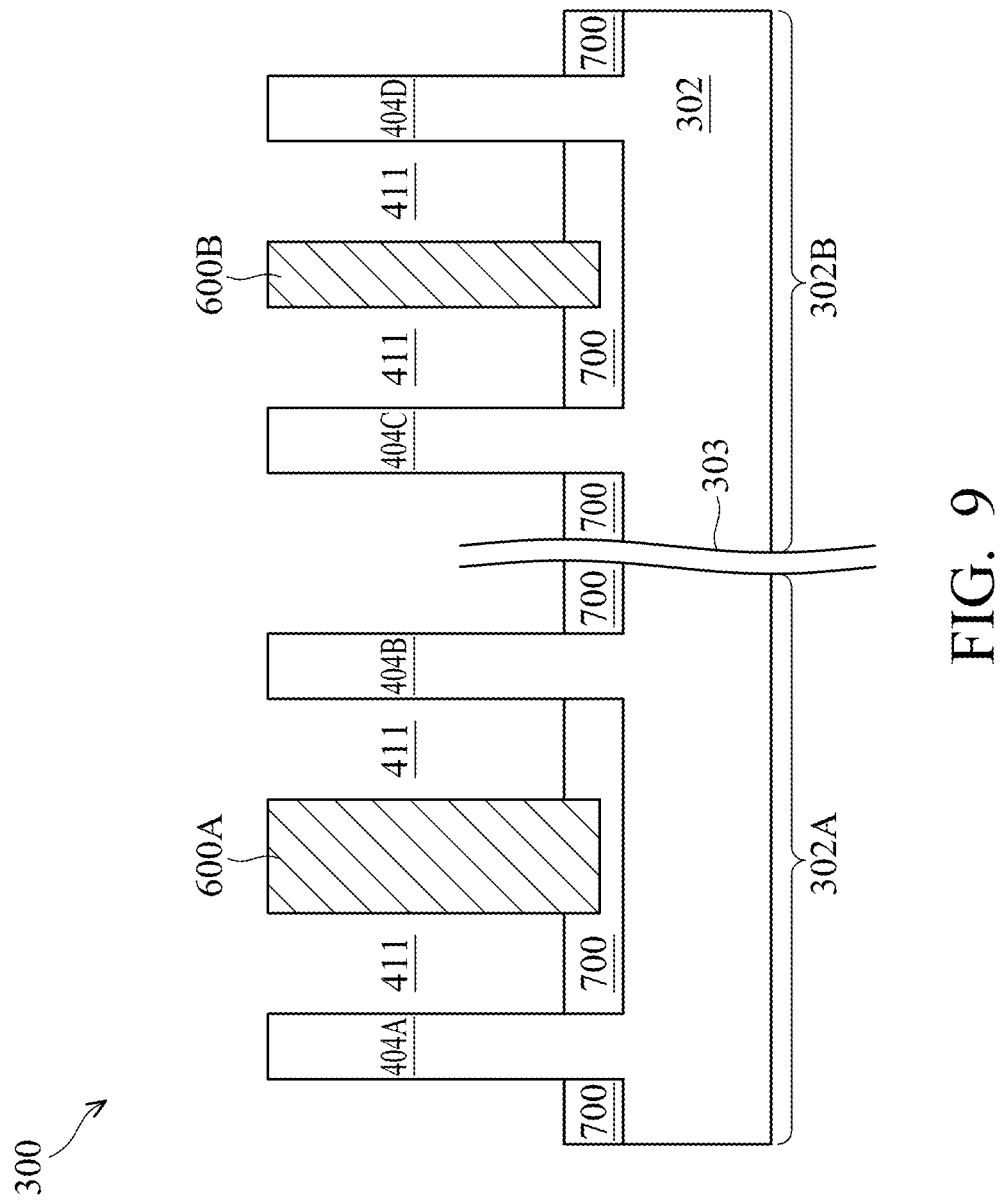

As another example, after forming the semiconductor fin structures 404A-D (FIG. 4), the insulation material of the isolation regions 700 may be deposited over the semiconductor fin structures 404A-D in a controlled deposition rate, thereby causing a cavity to be spontaneously formed in the trenches 411. The cavity is then filled with the dielectric material of the dummy channel layer 500, followed by a CMP process to form the dummy fin structures 600A-B. The isolation regions 700 are recessed to form the shallow trench isolation (STI) regions 700, as shown in FIG. 9. Using such a method to form the dummy fin structures 600A-B, the dummy fin structures 600A-B are formed on the isolation regions 700 and a bottom surface of the dummy fin structures 600A-B is embedded in the corresponding isolation region 700, as shown in FIG. 9. As yet another example, after forming the semiconductor fin structures 404A-D (FIG. 4) and depositing the insulation material of the isolation regions 700 over the semiconductor fin structures 404A-D, a patterned mask may be formed over the isolation regions 700 to expose portions of the isolation regions 700 to form the dummy fin structures 600A-B (e.g., in the trenches 411). Subsequently, the exposed portions of the isolation regions 700 may be etched using, for example, reactive ion etch (RIE), neutral beam etch (NBE), the like, or combinations thereof, thereby defining a cavity. The cavity is then filled with the dielectric material of the dummy channel layer 500, followed by a CMP process to form the dummy fin structures 600A-B, which is similar to the illustrated embodiment of FIG. 9.

Figure 10:
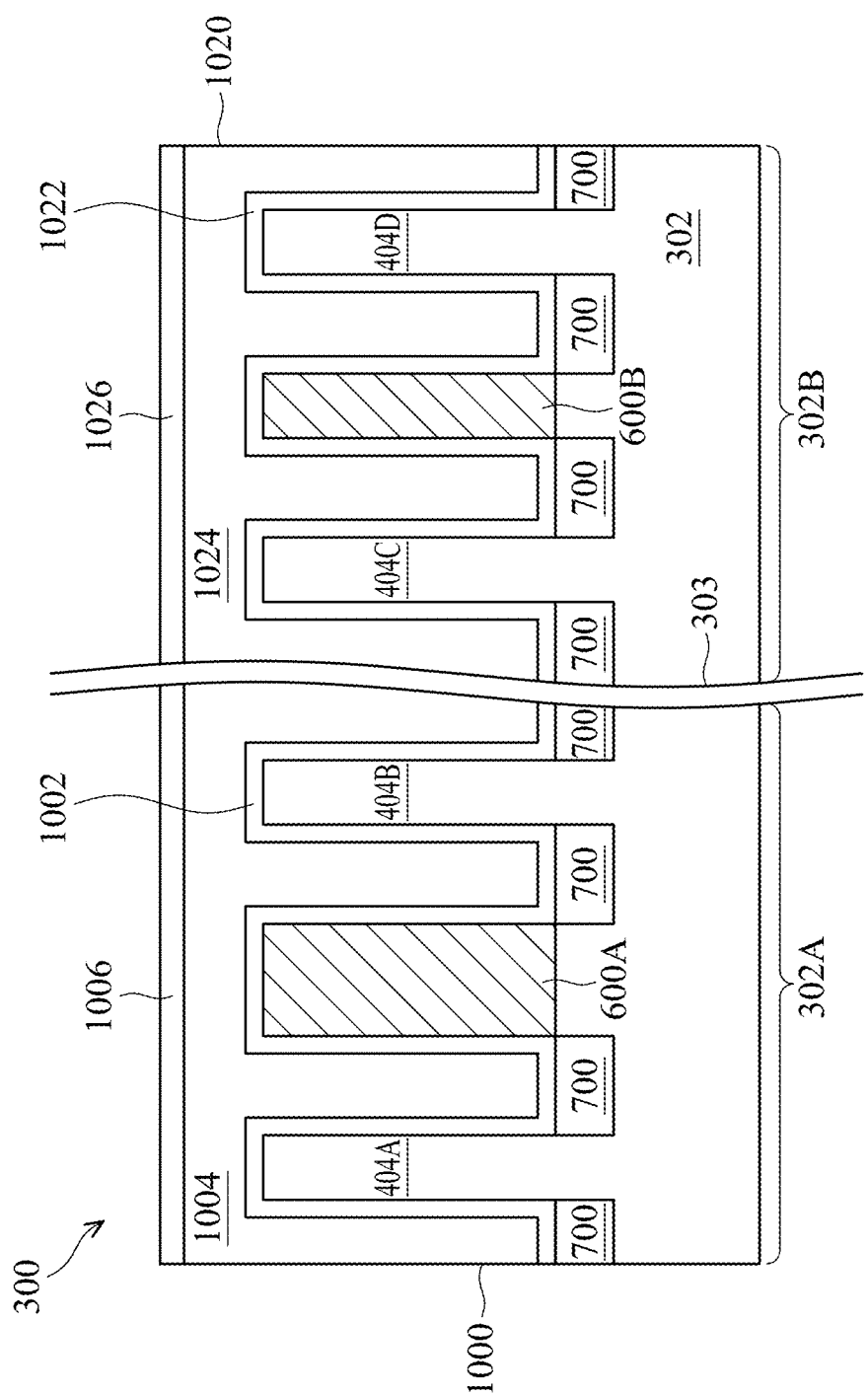

Corresponding to operation 210 of FIG. 2, FIG. 10 is a cross-sectional view of the FinFET device 300 including a dummy gate structure 1000 in the I/O area 302A and a dummy gate structure 1020 in the core area 302B at one of the various stages of fabrication. The cross-sectional view of FIG. 10 is cut along a lengthwise direction of the dummy gate structures 1000 and 1020 of the FinFET device 300 (e.g., cross-section B-B indicated in FIG. 1).

The dummy gate structure 1000 is formed to overlay a respective portion of each of the fin structures (e.g., semiconductor fin structures 400A-B, dummy fin structure 600A) in the core area 302B. Prior to, concurrently with, or subsequently to forming the dummy gate structure 1000 in the I/O area 302A, a dummy gate structure 1020 may be formed in the core area 302B to overlay a portion of each of the semiconductor fin structures 404C-D, and the dummy fin structure 600B. The dummy gate structure 1020 is similar to the dummy gate structure 1000, except for its dimensions, and thus, the dummy gate structure 1020 will be briefly discussed below.

The dummy gate structure 1000 includes a dummy gate dielectric 1002 and a dummy gate 1004, in some embodiments. A mask 1006 may be formed over the dummy gate structure 1000. To form the dummy gate structure 1000, a dielectric layer is formed on the semiconductor fin structures 404A-B and dummy fin structure 600A. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. Similarly, the dummy gate structure 1020 includes a dummy gate dielectric 1022 and a dummy gate 1024, with a mask 1026 formed thereon.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 1006 (1026). The pattern of the mask 1006 (1026) then may be transferred to the gate layer and the dielectric layer by a suitable etching technique to form the dummy gate 1004 (1024) and the underlying dummy gate dielectric 1002 (1022), respectively. The dummy gate 1004 and the dummy gate dielectric 1002 cover a respective portion (e.g., a channel region) of each of the semiconductor fin structures 404A-B and the dummy fin structure 600A; and the dummy gate 1024 and the dummy gate dielectric 1022 cover a portion (e.g., a channel region) of the semiconductor fin structures 404C-D and the dummy fin structure 600B. The dummy gate 1004 (1024) may also have a lengthwise direction (e.g., direction B-B of FIG. 1) perpendicular to the lengthwise direction (e.g., direction of A-A of FIG. 1) of the fin structures.

The dummy gate dielectric 1002 is shown to be formed over the semiconductor fin structures 404A-B and the dummy fin structure 600A (e.g., over the respective top surfaces and the sidewalls of the fin structures) and over the STI regions 700 in the example of FIG. 10. Similarly, the dummy gate dielectric 1022 is formed to overlay the semiconductor fin structures 404C-D and the dummy fin structure 600B (e.g., overlaying the respective top surfaces and the sidewalls of the fin structures). In other embodiments, the dummy gate dielectric 1002 (1022) may be formed by, e.g., thermal oxidization of a material of the semiconductor fin structures, and therefore, may be formed over the semiconductor fin structures but not over the STI regions 700. It should be appreciated that these and other variations are still included within the scope of the present disclosure.

Figure 11:
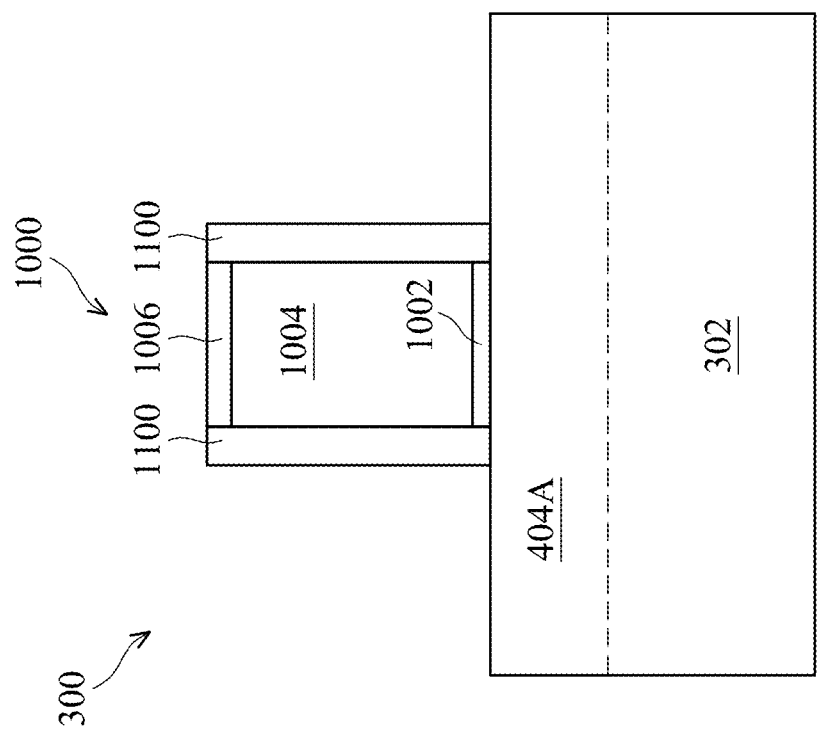
Figure 12:
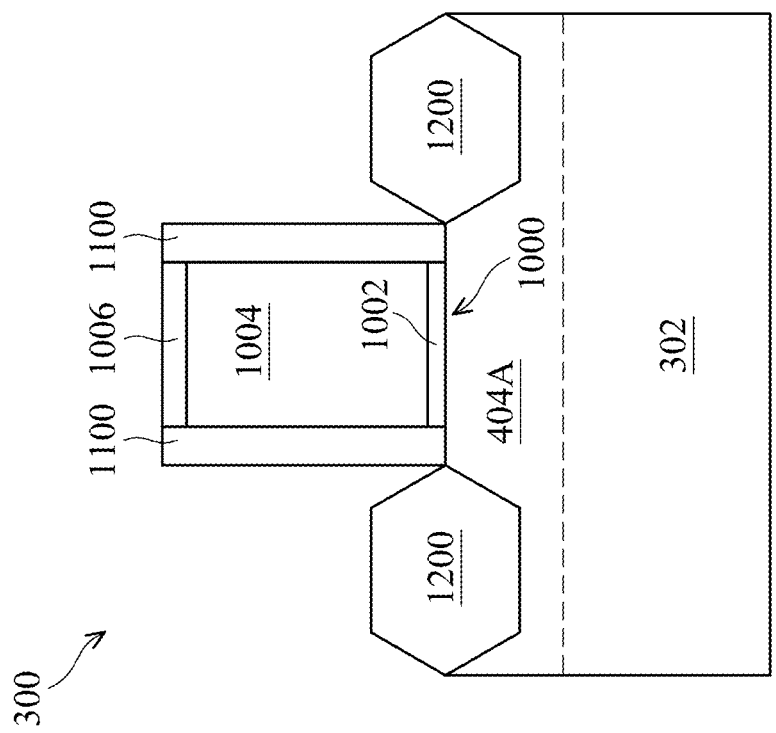
Figure 13:
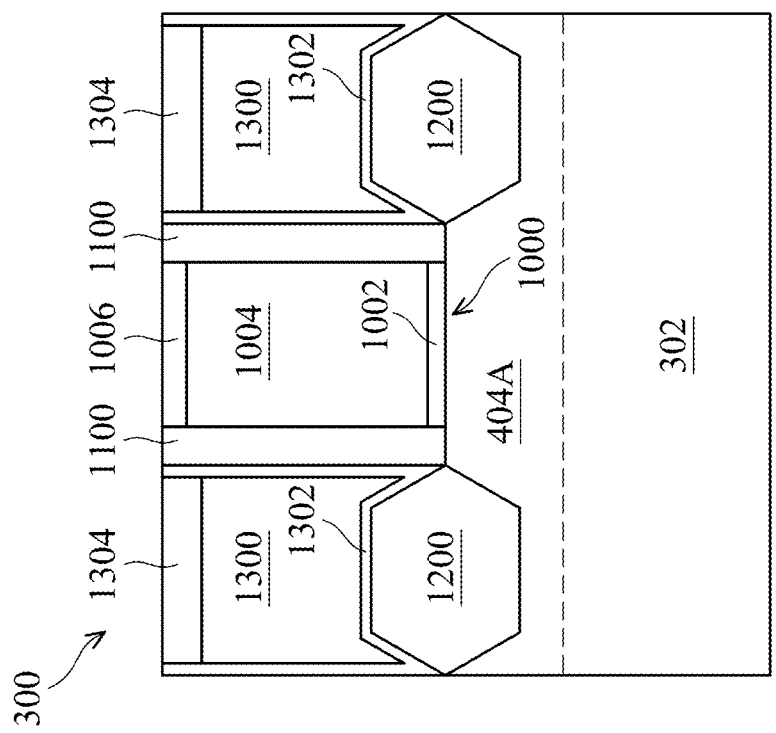

FIGS. 11-13 illustrate the cross-sectional views of further processing (or making) of the FinFET device 300 along cross-section A-A of one of the semiconductor fin structures 404A-D (as indicated in FIG. 1). One dummy gate structure 1000 is illustrated over the semiconductor fin structure 404A, which is selected as a representative example, in FIGS. 11-13. It should be appreciated that more than one dummy gate structure can be formed over the fin structure 404A (and each of the other fin structures, e.g., 404B-D, 600A-B), while remaining within the scope of the present disclosure.

Corresponding to operation 212 of FIG. 2, FIG. 11 is a cross-sectional view of the FinFET device 300 including gate spacer 1100 formed around (e.g., along and contacting the sidewalls of) the dummy gate structure 1000. For example, the gate spacer 1100 may be formed on opposing sidewalls of the dummy gate structure 1000. It should be understood that any number of gate spacers can be formed around the dummy gate structures 1000 while remaining within the scope of the present disclosure.

The gate spacer 1100 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1100. The shapes and formation methods of the gate spacer 1100 as illustrated in FIG. 11 are merely non-limiting examples, and other shapes and formation methods are possible. These and other variations are fully intended to be included within the scope of the present disclosure.

Corresponding to operation 214 of FIG. 2, FIG. 12 is a cross-sectional view of the FinFET device 300 including a number of source/drain regions 1200 at one of the various stages of fabrication. The source/drain regions 1200 are formed in recesses of the semiconductor fin structure 404A adjacent to the dummy gate structures 1000, e.g., between adjacent dummy gate structures 1000 and/or next to a dummy gate structure 1000. The recesses are formed by, e.g., an anisotropic etching process using the dummy gate structures 1000 as an etching mask, in some embodiments, although any other suitable etching process may also be used.

The source/drain regions 1200 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 12, the epitaxial source/drain structures 1200 may have surfaces raised from respective surfaces of the semiconductor fin structure 404A (e.g. raised above the non-recessed portions of the semiconductor fin structure 404A) and may have facets. In some embodiments, the source/drain structures 1200 of the adjacent semiconductor fin structures may merge to form a continuous epitaxial source/drain structure (not shown). In some embodiments, the source/drain structures 1200 of the adjacent semiconductor fin structures may not merge together and remain separate source/drain structures 1200 (not shown). In some embodiments, when the resulting FinFET device is an n-type FinFET, the source/drain structures 1200 can include silicon carbide (SiC), silicon phosphorous (SiP), phosphorous-doped silicon carbon (SiCP), or the like. In some embodiments, when the resulting FinFET device is a p-type FinFET, the source/drain structures 1200 comprise SiGe, and a p-type impurity such as boron or indium.

The epitaxial source/drain structures 1200 may be implanted with dopants to form source/drain structures 1200 followed by an annealing process. The implanting process may include forming and patterning masks such as a photoresist to cover the regions of the FinFET device 300 that are to be protected from the implanting process. The source/drain structures 1200 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structures 1200 of a P-type transistor. N-type impurities, such as phosphorous or arsenide, may be implanted in the source/drain structures 1200 of an N-type transistor. In some embodiments, the epitaxial source/drain structures 1200 may be in situ doped during their growth.

Corresponding to operation 216 of FIG. 2, FIG. 13 is a cross-sectional view of the FinFET device 300 including an interlayer dielectric (ILD) 1300 at one of the various stages of fabrication. In some embodiments, prior to forming the ILD 1300, a contact etch stop layer (CESL) 1302 is formed over the structure, as illustrated in FIG. 13. The CESL 1302 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1300 is formed over the CESL 1302 and over the dummy gate structures 1000. In some embodiments, the ILD 1300 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1300 is formed, an optional dielectric layer 1304 is formed over the ILD 1300. The dielectric layer 1304 can function as a protection layer to prevent or reduces the loss of the ILD 1300 in subsequent etching processes. The dielectric layer 1304 may be formed of a suitable material, such as silicon nitride, silicon carbonitride, or the like, using a suitable method such as CVD, PECVD, or FCVD. After the dielectric layer 1304 is formed, a planarization process, such as a CMP process, may be performed to achieve a level upper surface for the dielectric layer 1304. The CMP may also remove the mask 1006 and portions of the CESL 1302 disposed over the dummy gate 1004 (FIG. 12). After the planarization process, the upper surface of the dielectric layer 1304 is level with the upper surface of the dummy gate 1004, in some embodiments.

Figure 14:
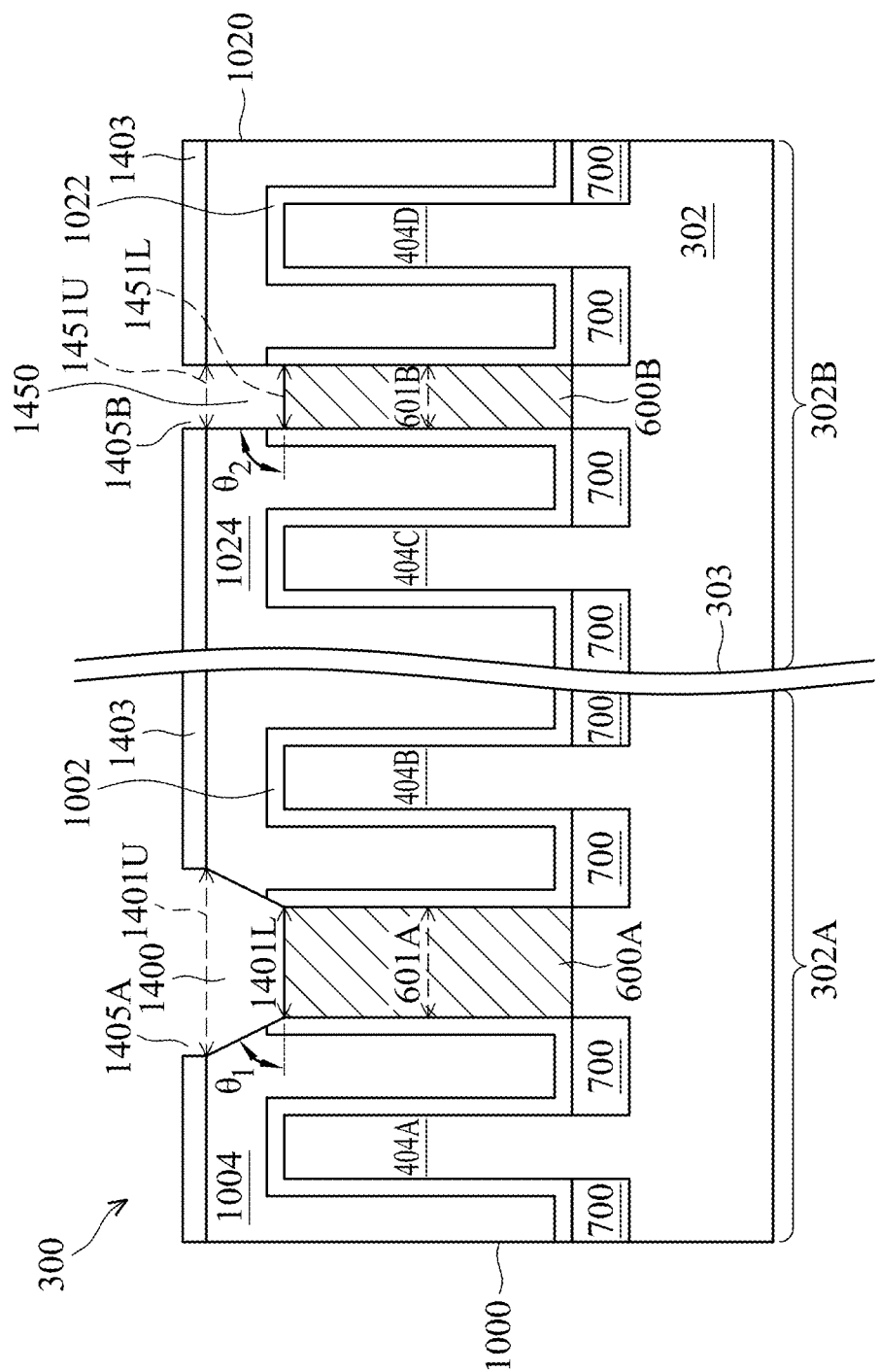

Corresponding to operation 218 of FIG. 2, FIG. 14 is a cross-sectional view of the FinFET device 300 in which the dummy gate structures 1000 and 1020 are respectively cut, intercepted, or otherwise disconnected to form a gate cut trench 1400 in the I/O area 302A and a gate cut trench 1450 in the core area 302B at one of the various stages of fabrication. The cross-sectional view of FIG. 14 is cut along the lengthwise direction of the dummy gate structures 1000 and 1020 of the FinFET device 300 (e.g., cross-section B-B indicated in FIG. 1).

The gate cut trenches 1400 and 1450 may extend along a direction perpendicular to the direction along which the dummy gate structures extend (e.g., cross-section A-A). As such, the gate cut trenches 1400 and 1450 is formed across a certain portion of each of the dummy gate structures 1000 and 1020 (e.g., by removing that portion). It should be understood that the gate cut trenches 1400 and 1450 can be formed across multiple dummy gate structures, while remaining within the scope of the present disclosure. For example, in the I/O area 302A, the gate cut trench 1400 can be formed across two or more dummy gate structures; and in the core area 302B, the gate cut trench 1450 can be formed across up to two dummy gate structures.

To form the gate cut trench 1400, one or more etching processes may be performed to remove a portion of the dummy gate 1004 and a portion of the dummy gate dielectric 1002 that are disposed over the dummy fin structure 600A. Concurrently with forming the gate cut trench 1400, the same etching process(es) may be performed to remove a portion of the dummy gate 1024 and a portion of the dummy gate dielectric 1022 that are disposed over the dummy fin structure 600B. The etching process(es) may stop when the top surfaces of the dummy fin structures 600A-B are respectively exposed. For example, the etching process(es), performed in the I/O area 302A, may stop once the top surface of the dummy fin structure 600A is exposed, while in the core area 302B, the etching process(es) may stop when the top surface of the dummy fin structure 600B is exposed. As such, a lower portion of the gate cut trench 1400 can follow the dimensions of the dummy fin structure 600A (e.g., the lower portion of the gate cut trench 1400 having a width, 1401L, that is about the same as the width (601A) of the dummy fin structure 600A); and a lower portion of the gate cut trench 1450 can follow the dimensions of the dummy fin structure 600B (e.g., the lower portion of the gate cut trench 1450 having a width, 1451L, that is about the same as the width (601B) of the dummy fin structure 600B).

Further, prior to the etching process(es), a mask 1403 may be formed over the dummy gate structures 1000 and 1020 to expose portions of the dummy gates 1004 and 1024 desired to be removed (e.g., the portions disposed over the dummy fin structures 600A and 600B) by forming openings 1405A in the I/O area 302A and 1405B in the core area 302B, respectively. In various embodiments, the opening 1405A may have a width wider than the dummy fin structure width 601A, and the opening 1405B may have a width about the same as the dummy fin structure width 601B. Through the mask 1403, the etching process(es) are performed to remove the respective portions of the dummy fin structures 1000 and 1020. By using a certain characteristic of the etching process (es) (which will be discussed as follows), the gate cut trench 1400 can be formed to have a reverse-trapezoid profile, e.g., with a width of its upper portion, 1401U, wider than the lower portion width (1401L); and the gate cut trench 1450 can be formed to have a rectangular profile, e.g., with a width of its upper portion, 1451U, about the same as the lower portion width (1451L).

In various embodiments, the etching process(es) may have one or more stages, each of which can be characterized with a respective combination of anisotropic etching and isotropic etching. For example, a first stage may have more anisotropic etching than isotropic etching. In other words, the first stage can vertically (or along a certain direction) etch the dummy gate structures 1000 and 1020 more quickly than it laterally etches the dummy gate structures 1000 and 1020. As such, after the first stage, the gate cut trenches 1400 and 1450 may each present a valley-shaped profile.

The first stage can include a plasma etching process. In such a plasma etching process (including radical plasma etching, remote plasma etching, and other suitable plasma etching processes), gaseous etchants such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gaseous etchants and combinations thereof can be used with passivation gases. The passivation gases can include nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the etchants and/or the passivation gases can be diluted with gases such as argon (Ar), helium (He), neon (Ne), and other suitable dilutive gases and combinations thereof.

As a non-limiting example, in the first stage, a source power $P_1$ (e.g., ranging from about 500 watts to about 800 watts) and a bias power $P_2$ (e.g., ranging from about 200 watts to 300 watts) may be applied during the first 60% of the first stage, under a pressure of 1 millitorr to 5 torr and an etch gas flow of 0 standard cubic centimeters per minute to 5000 standard cubic centimeters per minute. For the rest 40% of the first stage, while the source power $P_1$ may keep constant, the bias power may be reduced to about 0 watts. As such, during the first 60%, the first stage may present a higher amount/extent of the anisotropic etching, and during the rest 40%, the amount of anisotropic etching may be reduced to be comparable with an amount of the isotropic etching. However, it is noted that source powers (and their applied time durations), bias powers (and their applied time durations), pressures, and flow rates outside of these ranges can also be contemplated, while remaining within the scope of the present disclosure.

Following the first stage, a second stage performed may have a mixture of anisotropic etching and isotropic etching. In other words, the second stage can vertically (or along a certain direction) etch the dummy gate structures 1000 and 1020 while laterally etching the dummy gate structures 1000 and 1020. The valley-shaped profiles of the gate cut trenches 1400 and 1450 can thus laterally extend until the gate cut trenches 1400 and 1450 almost fully expose the top surfaces of the dummy fin structures 600A an 600B, respectively, which causes the respective lower portions of the gate cut trenches 1400 and 1450 to follow the dimensions of the dummy gate structures 600A and 600B. As such, the gate cut trench 1400 can present a reverse-trapezoid profile and the gate cut trench 1450 can present a rectangular profile, as illustrated in FIG. 14. For example, the gate cut trench 1400 has its upper portion with a width, 1401U, that is greater than the width 1401L of its lower portion, and the gate cut trench 1450 has its upper portion with a width, 1451U, that is about the same as the width 1451L of its lower portion. Alternatively stated, the gate cut trench 1400 may have at least one of its sidewalls with a projection of the top surface of the dummy fin structure 600A to form an acute angle, $\theta_1$, and the gate cut trench 1450 may have at least one of its sidewalls with a projection of the top surface of the dummy fin structure 600B to form a nearly right angle, $\theta_2$. In a non-limiting example, the angle $\theta_1$ may range between about 60 degrees and about 80 degrees, and the angle $\theta_2$ may be about 90 degrees.

The second stage can include a plasma etching process. In such a plasma etching process (including radical plasma etching, remote plasma etching, and other suitable plasma etching processes), gaseous etchants such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gaseous etchants and combinations thereof can be used with passivation gases. The passivation gases can include nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the etchants and/or the passivation gases can be diluted with gases such as argon (Ar), helium (He), neon (Ne), and other suitable dilutive gases and combinations thereof.

As a non-limiting example, in the second stage, a source power $P_1$ (e.g., ranging from about 800 watts to about 1200 watts) and a bias power $P_2$ (e.g., ranging from about 200 watts to 300 watts) may be applied during the first 10% of the second stage, under a pressure of 1 millitorr to 5 torr and an etch gas flow of 0 standard cubic centimeters per minute to 5000 standard cubic centimeters per minute. For the next 40% of the second stage, the source power may be reduced to $P_3$ (e.g., ranging from about 120 watts to 160 watts), and the bias power may be reduced to about 0 watts. During the rest 50% of the second stage 1501, the source power is reduced to about 0 watts, and the bias power is increased to $P_4$, which ranges from about 80 watts to about 100 watts. As such, after the first 10% (the next 40%), the second stage may present a higher amount/extent of the isotropic etching than an amount of the anisotropic etching, which may result from a relatively high amount of radicals. During the rest 50%, the second stage may present a higher amount of the anisotropic etching than an amount of the isotropic etching. For example, in the rest 50%, the radicals can be pulled along a certain direction (e.g., a vertical direction) to further shape the valley-shaped profiles to present the profiles, as shown in FIG. 14. However, it is noted that source powers (and their applied time durations), bias powers, pressures (and their applied time durations), and flow rates outside of these ranges can also be contemplated, while remaining within the scope of the present disclosure.

Figure 15:
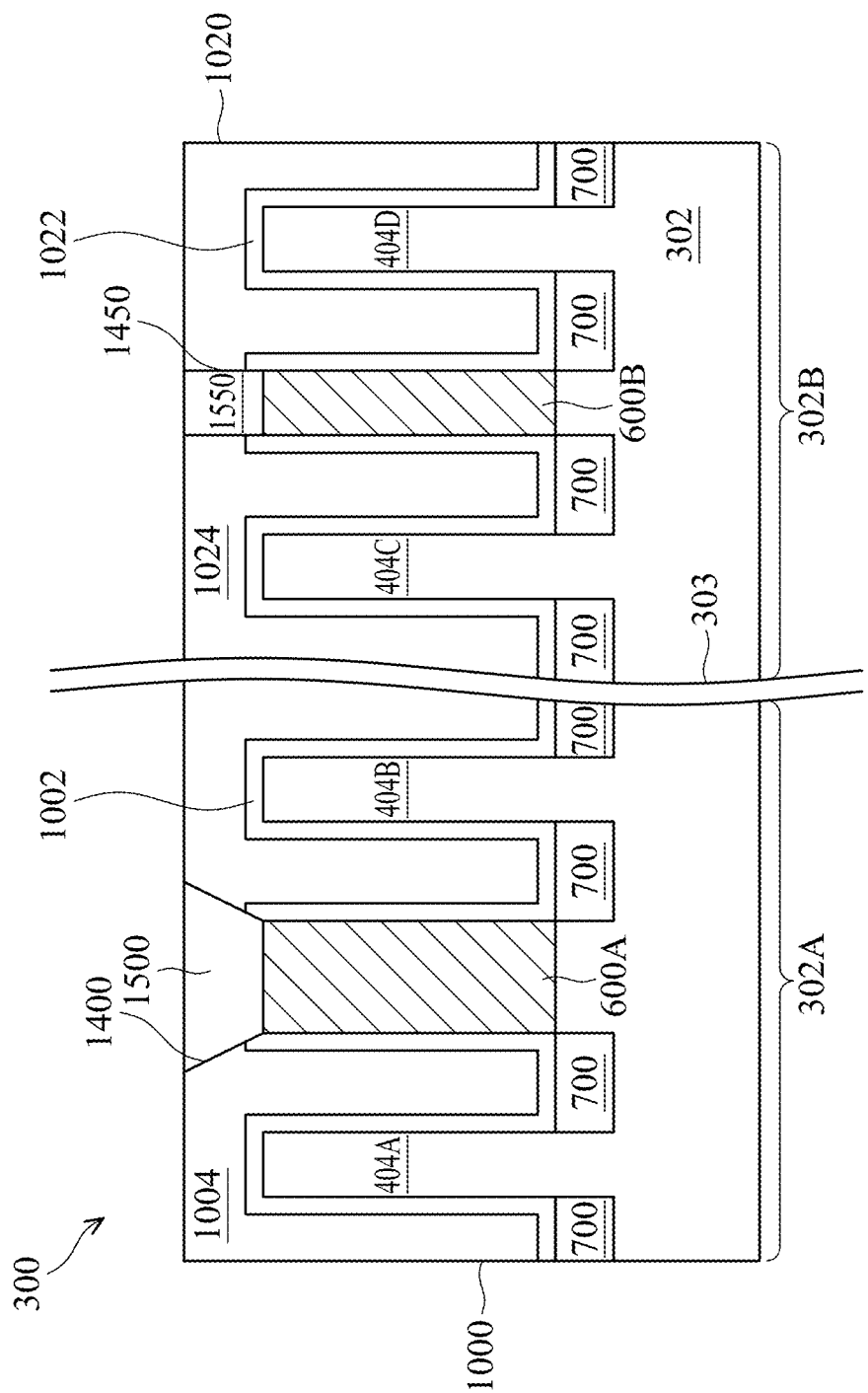

Corresponding to operation 220 of FIG. 2, FIG. 15 is a cross-sectional view of the FinFET device 300 including a gate isolation structure 1500 in the I/O area 302A and a gate isolation structure 1550 in the core area 302B at one of the various stages of fabrication. The cross-sectional view of FIG. 15 is cut along the lengthwise direction of the dummy gate structures 1000 and 1020 of the FinFET device 300 (e.g., cross-section B-B indicated in FIG. 1).

The gate isolation structures 1500 and 1550 are formed by filling the gate cut trenches 1400 and 1450, respectively, with a dielectric material. As such, the gate isolation structures 1500 and 1550 can inherit the profiles (or dimensions) of the gate cut trenches 1400 and 1450, respectively. For example, the gate isolation structure 1500 can have its sidewalls separated from each other by a distance (or a critical dimension) gradually decreasing with an increasing depth toward the dummy fin structure 600A. Alternatively stated, one sidewall of the gate isolation structure 1500 (e.g., the sidewall of the left-hand side in FIG. 15) can tilt toward the semiconductor fin structure 404A, and the other sidewall of the gate isolation structure 1500 (e.g., the sidewall of the right-hand side in FIG. 15) can tilt toward the semiconductor fin structure 404B. The gate isolation structure 1550 can have its sidewalls separated from each other by a distance (or a critical dimension), with a variation less than ±10%. Alternatively stated, both sidewalls of the gate isolation structure 1550 may be nearly perpendicular to the top surface of the dummy fin structure 600B.

The dielectric material that is used to form the gate isolation structures 1500 and 1550 may include, for example, silicon oxide, silicon nitride, silicon oxynitride, silicon carbide, silicon carbonitride, silicon oxycarbonitride, silicon oxycarbide, or combinations thereof. The gate isolation structures 1500 and 1550 can be formed by depositing the dielectric material in the gate cut trenches 1400 and 1450, respectively, using any suitable method, such as CVD, PECVD, or FCVD. After the deposition, a CMP may be performed to remove any excess dielectric material from the remaining dummy gate structures 1000 and 1020.

Although the examples of FIG. 15 show that the gate isolation structures 1500 and 1550 respectively fill the gate cut trenches 1400 and 1450 with a single dielectric piece (which can include one or more dielectric materials listed above), it is understood that the gate isolation structures 1500 and 1550 can each include multiple pieces. Each of the pieces may include, for example, silicon oxide, silicon nitride, silicon oxynitride, silicon carbide, silicon carbonitride, silicon oxycarbonitride, silicon oxycarbide, or combinations thereof. For example, the gate isolation structures 1500 and 1550 may each include a first piece, which is formed as a conformal layer lining the respective gate cut trench, and a second piece, which fills the gate cut trench with the first piece coupled therebetween. In another example, the gate isolation structures 1500 and 1550 may each include a first piece, which fills a lower portion of the respective gate cut trench, and a second piece, which fills an upper portion of the gate cut trench.

Figure 16:
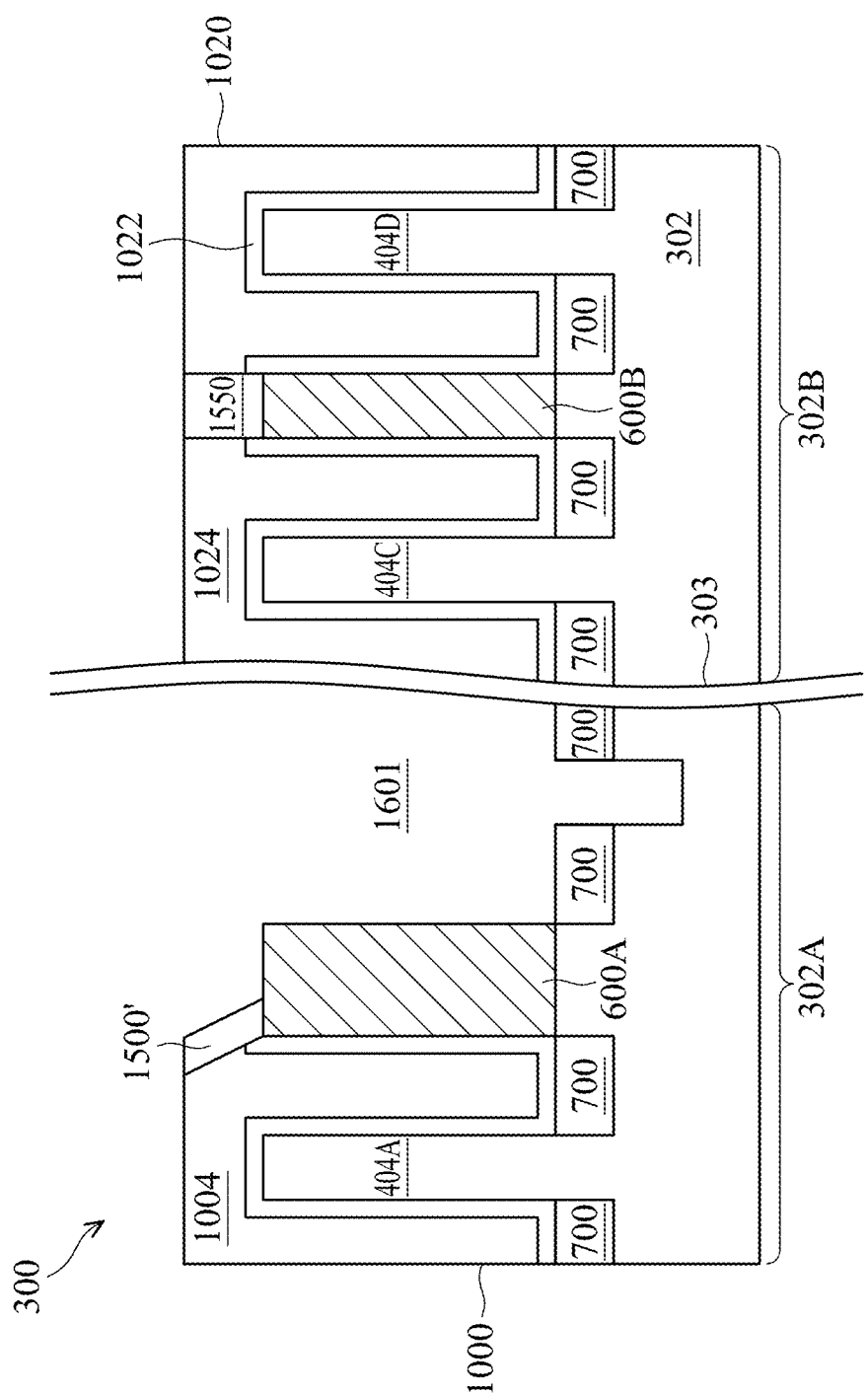

Corresponding to operation 222 of FIG. 2, FIG. 16 is a cross-sectional view of the FinFET device 300 in which a cavity 1601 is formed at one of the various stages of fabrication. The cross-sectional view of FIG. 16 is cut along the lengthwise direction of the dummy gate structures 1000 and 1020 of the FinFET device 300 (e.g., cross-section B-B indicated in FIG. 1).

To form the cavity 1601 that is configured to remove the semiconductor fin structure 404B, which functions as an inactive channel, at least some of the following operations may be performed: (i) forming a patterned mask over the workpiece that exposes a portion of the dummy gate structure 1000 overlaying the semiconductor fin structure 404B and a portion of the gate isolation structure 1500 (FIG. 15); (ii) performing a first etching process to remove the exposed portion of the dummy gate structure 1000 and the exposed portion of the gate isolation structure 1500 (thereby exposing the semiconductor fin structure 404B); (iii) performing a second etching process to remove an upper portion of the semiconductor fin structure 404B (e.g., the portion located above the top surface of the STI region 700); and (iv) performing a third etching process to remove a lower portion of the semiconductor fin structure 404B (e.g., the portion located below the top surface of the STI region 700) and a portion of the substrate 302 (e.g., the portion located below a bottom surface of the STI region 700). Such a series of operations to remove an inactive channel may sometimes be referred to as a Cut Poly Oxide Diffusion Edge (CPODE) process.

With the wider upper portion of the gate isolation structure 1500 (FIG. 15) present, etchants used in the CPODE process (e.g., chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), etc.) cannot easily penetrate through the gate isolation structure 1500. As such, damage to the portion of the dummy gate structure 1000 that overlays the semiconductor fin structure 404A (which functions as an active channel) can be minimized, which can well reserve the dimensions and profiles of an active gate structure that will replace the remaining portion of the dummy gate structure 1000.

In various embodiments, a portion of the gate isolation structure 1500' may remain, as shown in FIG. 16. For example in FIG. 16, the remaining gate isolation structure 1500' can have one sidewall that contacts the remaining portion of the dummy gate structure 1000 reserved (i.e., unexposed), and the other sidewall exposed in the cavity 1601. As such, the unexposed sidewall can still tilt toward the remaining portion of the dummy gate structure 1000, and the exposed sidewall may also tilt toward the remaining portion of the dummy gate structure 1000. It should be understood that the exposed sidewall may be formed in any of various other profiles (e.g., nearly perpendicular to the top surface of the dummy fin structure 600A, tilted away from the remaining portion of the dummy gate structure 1000, etc.), while remaining within the scope of the present disclosure. In some embodiments, the remaining gate isolation structure 1500' can have a uniform width, as shown in FIG. 16. Alternatively stated, a distance between the sidewalls of the remaining gate isolation structure 1500' may remain the same, with the increasing height of the remaining gate isolation structure 1500'.

Figure 17:
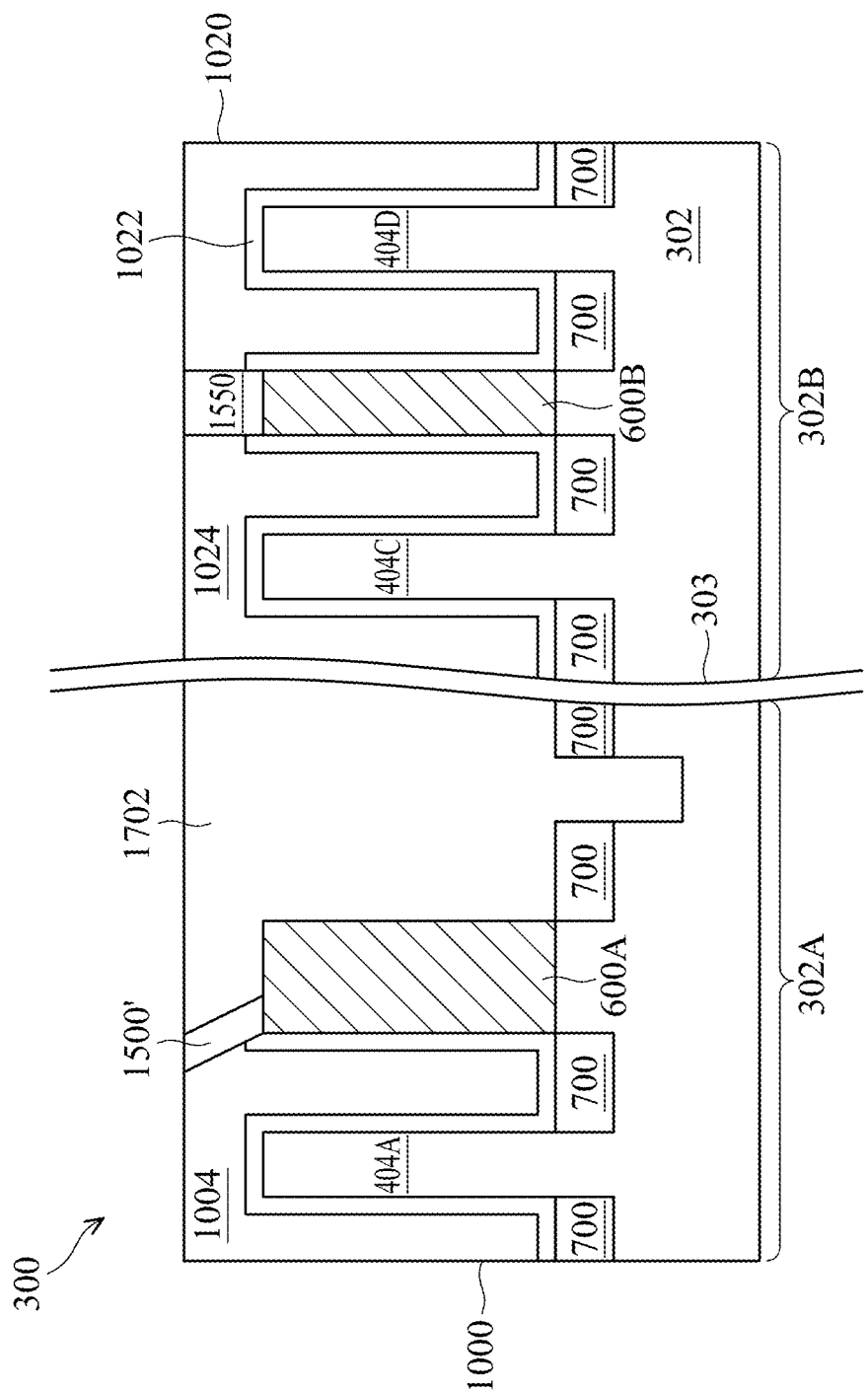

Corresponding to operation 224 of FIG. 2, FIG. 17 is a cross-sectional view of the FinFET device 300 in which the cavity 1601 (FIG. 16) is filled with a dielectric refill material 1702 at one of the various stages of fabrication. The cross-sectional view of FIG. 17 is cut along the lengthwise direction of the dummy gate structures 1000 and 1020 of the FinFET device 300 (e.g., cross-section B-B indicated in FIG. 1).

In various embodiments, the dielectric refill material 1702 may be, for example, silicon oxide, silicon nitride, silicon oxynitride, silicon carbide, silicon carbonitride, silicon oxycarbonitride, silicon oxycarbide, multilayers thereof, or the like. The dielectric refill material 1702 can inherit the profiles and dimensions of the cavity 1601 (FIG. 16). For example, the dielectric refill material 1702 can extend through the STI region 700 and into the substrate 302; the dielectric refill material 1702 can overlay a portion of the top surface of the dummy fin structure 600A and extends along one of the sidewalls of the dummy fin structure 600A; and the dielectric refill material 1702 can contact the sidewall of the remaining gate isolation structure 1500' exposed in the cavity 1601.

Figure 18:
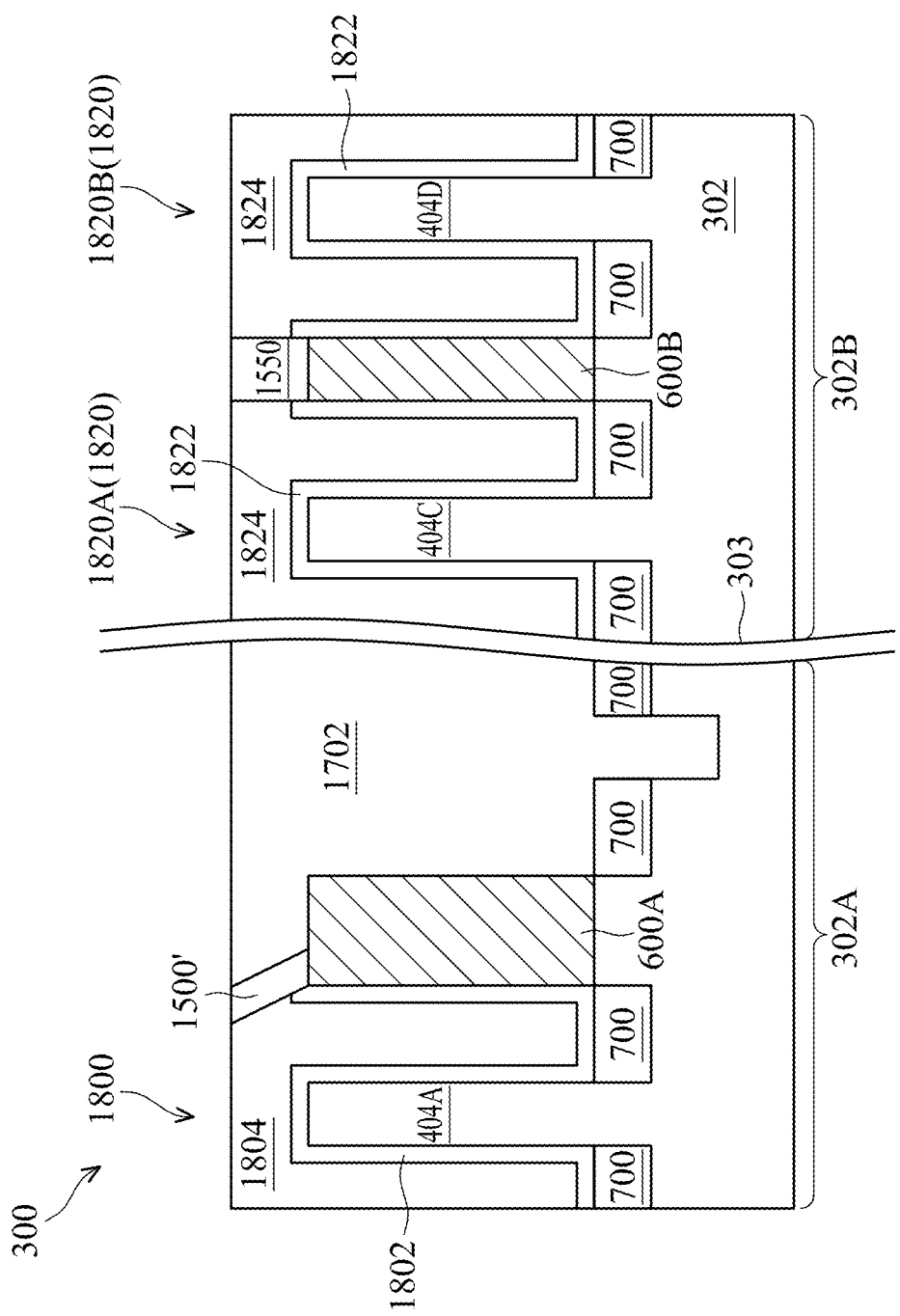

Corresponding to operation 226 of FIG. 2, FIG. 18 is a cross-sectional view of the FinFET device 300 including an active gate structure 1800 in the I/O area 302A and an active gate structure 1820 in the core area 302B at one of the various stages of fabrication. The cross-sectional view of FIG. 18 is cut along the lengthwise direction of the active gate structures 1800 and 1820 of the FinFET device 300 (e.g., cross-section B-B indicated in FIG. 1).

The active gate structure 1800 may be formed by replacing the remaining dummy gate structure 1000 (FIG. 17); and the active gate structure 1820 may be formed by replacing the dummy gate structure 1020 (FIG. 17). As illustrated, the active gate structure 1800 is separated from the dielectric refill material 1702 with the remaining gate isolation structure 1500' and the dummy fin structure 600A; and the active gate structure 1820 may include two portions 1820A and 1820B that are separated by the gate isolation structure 1550 and the dummy fin structure 600B. Further, the remaining gate isolation structure 1500' can contact an upper portion of the active gate structure 1800 at a first tilted interface, and contact the dielectric refill material 1702 at a second tilted interface. The active gate structure 1800 can overlay the semiconductor fin structure 404A, which can function as the active channel of an I/O transistor; the portion 1820A can overlay the semiconductor fin structure 404C, which can function as the active channel of a first core transistor; and the portion 1820B can overlay the semiconductor fin structure 404D, which can function as the active channel of a second core transistor.

The active gate structures 1800 and 1820 can each include a gate dielectric layer (e.g., 1802, 1822), a metal gate layer (1804, 1824), and one or more other layers that are not shown for clarity. For example, each of the active gate structures 1800 and 1820 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers 1802 and 1822 each include silicon oxide, silicon nitride, or multilayers thereof. In example embodiments, the gate dielectric layers 1802 and 1822 each include a high-k dielectric material, and in these embodiments, the gate dielectric layers 1802 and 1822 may each have a k value greater than about 7.0, and may include a metal oxide or a silicate of Hf, Al, Zr, La, Mg, Ba, Ti, Pb, or combinations thereof. The formation methods of the gate dielectric layers 1802 and 1822 may include molecular beam deposition (MBD), atomic layer deposition (ALD), PECVD, and the like. A thickness of each of the gate dielectric layers 1802 and 1822 may be between about 8 angstroms (Å) and about 20 Å, as an example.

The metal gate layers 1804 and 1824 may each be a P-type work function layer, an N-type work function layer, multi-layers thereof, or combinations thereof, in some embodiments. Accordingly, the metal gate layers 1804 and 1824 may each be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

In one aspect of the present disclosure, a semiconductor device is disclosed. The semiconductor device includes a substrate including a first area and a second area, wherein a first density of transistors formed in the first area is greater than a second density of transistors formed in the second area. The semiconductor device in the first area includes: a first portion of a first gate structure that straddles a first semiconductor fin structure, wherein the first gate structure extends along a first lateral direction; a second portion of the first gate structure that straddles a second semiconductor fin structure, wherein the first and second semiconductor fin structures both extend along a second lateral direction perpendicular to the first lateral direction; and a first gate isolation structure that separates the first and second portions of the first gate structure from each other, wherein the first gate isolation structure has almost vertical sidewalls. The semiconductor device in the second area includes: a second gate structure that straddles a third semiconductor fin structure, wherein the second gate structure and the third semiconductor fin structure extend along the first and second lateral directions, respectively; and a second gate isolation structure that separates the second gate structure from a dielectric refill material, wherein the second gate isolation structure has tilted sidewalls.

In yet another aspect of the present disclosure, a semiconductor device is disclosed. The semiconductor device includes: a substrate; a semiconductor fin structure disposed over the substrate, wherein the semiconductor fin structure extend along a first lateral direction; a gate structure that straddles a semiconductor fin structure, wherein the gate structure extends along a second lateral direction, the first lateral direction perpendicular to the second lateral direction; a dielectric fin structure that extends along the first lateral direction and is disposed next to the semiconductor structure fin structure; and a gate isolation structure disposed above the dielectric fin structure. The gate isolation structure contacts an upper portion of the gate structure at a first tilted interface.

In yet another aspect of the present disclosure, a method of making a semiconductor device is disclosed. The method includes forming a first semiconductor fin structure and a second semiconductor fin structure over a substrate that both extend along a first direction. The method includes forming a dummy gate structure that extends along a second direction perpendicular to the first direction and straddles the first and second semiconductor fin structures. The method includes removing a portion of the dummy gate structure between the first and second semiconductor fin structures to form a trench, wherein a width of the trench along the second direction decrease with increasing depth toward the substrate. The method includes filling the trench with a dielectric material. The method includes removing the second semiconductor fin structure and a portion of the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
    forming a first semiconductor fin structure and a second semiconductor fin structure over a substrate that both extend along a first lateral direction;
    forming a dummy gate structure that extends along a second lateral direction perpendicular to the first direction and straddles the first and second semiconductor fin structures;
    removing a portion of the dummy gate structure between the first and second semiconductor fin structures to form a trench, wherein a width of the trench along the second lateral direction decrease with increasing depth toward the substrate;
    filling the trench with a dielectric material; and
    removing the second semiconductor fin structure and a portion of the dielectric material.

2. The method of claim 1, further comprising forming a dielectric fin structure that extends along the first direction and is disposed between the first and second semiconductor fin structures.

3. The method of claim 2, wherein a width of the dielectric fin structure extending along the second lateral direction is about 15 nanometers (nm) and about 30 nm.

4. The method of claim 2, further comprising depositing a dielectric refill material that overlays: one sidewall of a remaining portion of the dielectric material, a portion of a top surface of the dielectric fin structure, and one sidewall of the dielectric fin structure.

5. The method of claim 4, further comprising forming a gate isolation structure separating the dielectric refill material from a remaining portion of the dummy gate structure.

6. The method of claim 5, wherein the gate isolation structure to tilted upward to a top surface of the remaining portion of the dummy gate structure.

7. The method of claim 6, wherein an angle between the gate isolation structure and a major top surface of the substrate is in a range from about 60 degrees to about 80 degrees.

8. The method of claim 7, wherein the angle between the gate isolation structure and a major top surface of the substrate is in a range from about 65 degrees to about 75 degrees.

9. The method of claim 4, wherein the dielectric refill material extends through a shallow trench isolation region and into the substrate.

10. The method of claim 1, further comprising forming a shallow trench isolation structure interposed between respective lower portions of the first semiconductor fin structure and the second semiconductor fin structure along the second lateral direction.

11. A method for making a semiconductor device, comprising:
    forming a semiconductor fin structure over a substrate and along a first lateral direction;
    forming a gate structure straddling the semiconductor fin structure and extending along a second lateral direction perpendicular to the first lateral direction;
    forming a dielectric fin structure extending along the first lateral direction and positioned next to the semiconductor structure fin structure; and
    forming a gate isolation structure above the dielectric fin structure, wherein the gate isolation structure contacts an upper portion of the gate structure and extends in a third direction that is directed upward to a top surface of the gate structure and tilted toward the gate structure.

12. The method of claim 11, further comprising:
    forming a dielectric refill material structure, wherein the dielectric refill material structure contacts the gate isolation structure at a tilted interface.

13. The method of claim 12, wherein the dielectric refill material structure overlays one sidewall and a portion of a top surface of the dielectric fin structure.

14. The method of claim 12, wherein the dielectric refill material structure extends through a shallow trench isolation region and into the substrate.

15. The method of claim 11, wherein the semiconductor fin structure, the gate structure, the dielectric fin structure, and the gate isolation structure are disposed in an input/output area of the substrate.

16. The method of claim 11, wherein a width of the dielectric fin structure extending along the second lateral direction is about 15 nanometers (nm) and about 30 nm.

17. A method for making a semiconductor device, comprising:
    forming a semiconductor fin structure disposed over a substrate and extending along a first lateral direction;

forming a gate structure straddling the semiconductor fin structure and extending along a second lateral direction perpendicular to the first lateral direction;

forming a dielectric fin structure extending along the first lateral direction and disposed next to the semiconductor fin structure; and forming a gate isolation structure disposed above the dielectric fin structure and separating the gate structure from a dielectric refill material, wherein the gate isolation structure has tilted sidewalls, and wherein the gate isolation structure extends in a third direction that is directed upward to a top surface of the gate structure and tilted toward the gate structure.

18. The method of claim 17, wherein the gate isolation structure contacts an upper portion of the gate structure at a first tilted interface.

19. The method of claim 17, wherein the gate isolation structure contacts the dielectric refill material at a second tilted interface.

20. The method of claim 17, wherein the dielectric refill material extends through a shallow trench isolation region and into the substrate.

* * * * *